US006747903B1

United States Patent
Pan et al.

(10) Patent No.: US 6,747,903 B1
(45) Date of Patent: Jun. 8, 2004

(54) CONFIGURABLE DECODER FOR ADDRESSING A MEMORY

(75) Inventors: Philip Y. Pan, Fremont, CA (US);
Chiakang Sung, Milpitas, CA (US);
Joseph Huang, San Jose, CA (US);
Bonnie Wang, Cupertino, CA (US);
Khai Nguyen, San Jose, CA (US);
Xiaobao Wang, Santa Clara, CA (US);
Gopinath Rangan, Santa Clara, CA (US); In Whan Kim, San Jose, CA (US); Yan Chong, Stanford, CA (US);
Tzung-Chin Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 327 days.

(21) Appl. No.: 10/046,939

(22) Filed: Jan. 14, 2002

Related U.S. Application Data

(63) Continuation-in-part of application No. 09/883,087, filed on Jun. 15, 2001, now Pat. No. 6,661,733.
(60) Provisional application No. 60/211,936, filed on Jun. 15, 2000.

(51) Int. Cl.[7] .................................................. G11C 7/00
(52) U.S. Cl. ........................... 365/189.01; 365/230.05; 365/230.06; 365/230.02
(58) Field of Search .................... 365/189.01, 230.02, 365/230.05, 230.06, 189.02; 326/39, 41

(56) References Cited

U.S. PATENT DOCUMENTS

| | | | | | |
|---|---|---|---|---|---|
| 6,020,759 | A | * | 2/2000 | Heile | ............................ 326/40 |
| 6,396,302 | B2 | * | 5/2002 | New et al. | ..................... 326/38 |
| 6,459,303 | B1 | * | 10/2002 | Chang et al. | ................ 326/105 |

* cited by examiner

*Primary Examiner*—Vu A. Le
(74) *Attorney, Agent, or Firm*—Townsend and Townsend and Crew LLP; J. Matthew Zigmant

(57) ABSTRACT

Methods and apparatus for decoding addresses in a memory to provide mixed input and output data widths. A method includes receiving an address portion comprising a first number of bits. A second number of bits of the address portion are blocked, where the second number is less than the first number. A third number of bits are not blocked, and the third number plus the second number equal the first number. The third number of bits are decoded and a fourth number of memory cells are selected. The fourth number is equal to two to the power of the second number. A fourth number of data bits are received and multiplexed to the selected memory cells. The data bits are written to the selected memory cells.

27 Claims, 30 Drawing Sheets

PRODUCT TERM = A·B·$\overline{C}$   1305   1300

1310  A "MATCH" OCCURS WHEN A=1, B=1, C=0

HIGH IMPEDENCE AT  1350
SENSE AMPLIFIER
INPUT

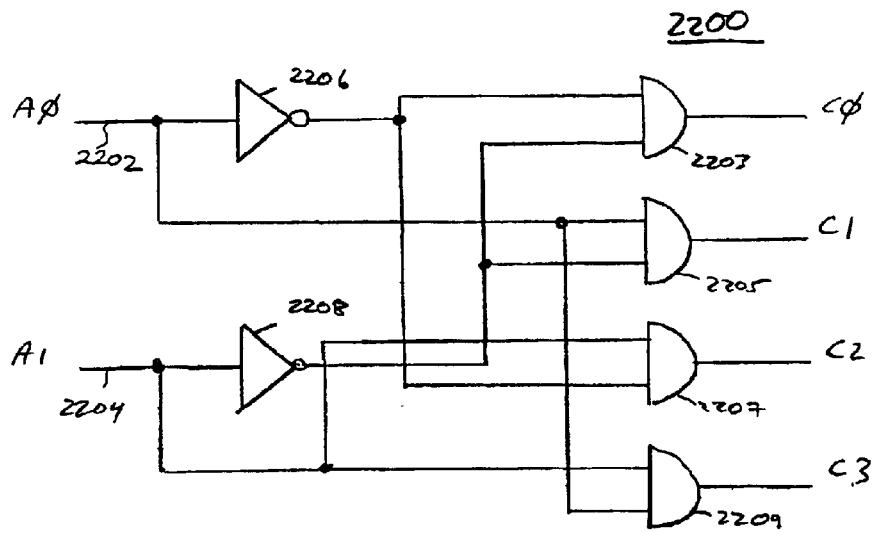
| A1 | A0 | C0 | C1 | C2 | C3 |
|----|----|----|----|----|----|
| 0  | 0  | 1  | 0  | 0  | 0  |
| 0  | 1  | 0  | 1  | 0  | 0  |
| 1  | 0  | 0  | 0  | 1  | 0  |
| 1  | 1  | 0  | 0  | 0  | 1  |
2210
2220
$C0 = \overline{A1} \cdot \overline{A0}$
$C1 = \overline{A1} \cdot A0$
$C2 = A1 \cdot \overline{A0}$
$C3 = A1 \cdot A0$
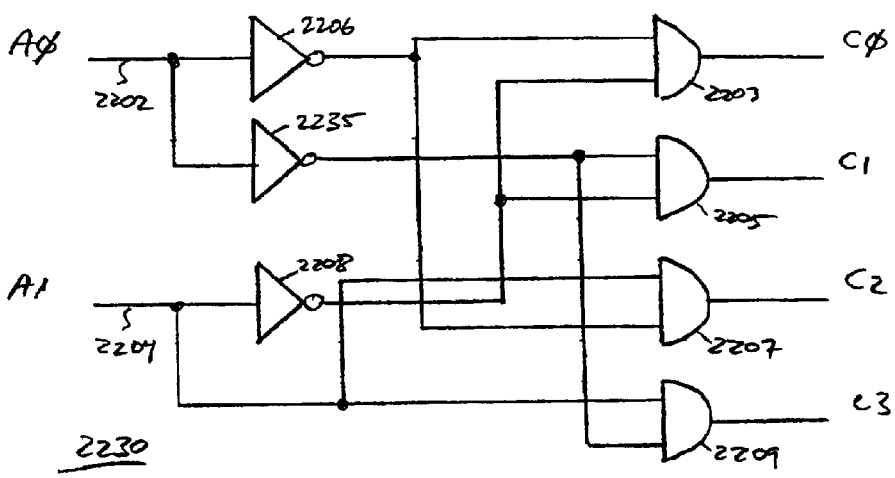
2230
2240
$C0 = \overline{A1} \cdot \overline{A0}$
$C1 = \overline{A1} \cdot \overline{A0}$
$C2 = A1 \cdot \overline{A0}$
$C3 = A1 \cdot \overline{A0}$
2250
| A1 | A0 | C0 | C1 | C2 | C3 |   |
|----|----|----|----|----|----|---|
| 0  | 0  | 1  | 1  | 0  | 0  | ~2252 |
| 0  | 1  | 0  | 0  | 0  | 0  | -2254 |
| 1  | 0  | 0  | 0  | 1  | 1  | -2256 |
| 1  | 1  | 0  | 0  | 0  | 0  | -2258 |
FIGURE 22

CONFIGURABLE DECODER FOR ADDRESSING A MEMORY

CROSS-REFERENCES TO RELATED APPLICATIONS

This is a continuation-in-part of U.S. application Ser. No. 09/883,087, filed Jun. 15, 2001, now U.S. Pat. No. 6,661,733 which claims the benefit of U.S. provisional patent application Ser. No. 60/211,936, filed Jun. 15, 2000, which are both incorporated by reference along with all other documents listed in this application.

BACKGROUND OF THE INVENTION

The present invention relates to the field of integrated circuits and in particular, to a dual-port memory within a programmable logic integrated circuit.

Programmable logic integrated circuits such as PALs, PLDs, FPGAs, LCAs, and others are becoming more complex and continually evolving to provide more user-programmable features on a single integrated circuit. Modem programmable logic integrated circuits incorporate programmable logic including logic gates, products terms, or look-up tables. Programmable logic integrated circuits also include embedded user-programmable memory or RAM.

Despite the success of programmable logic, there is a continuing desire to provide greater functionality and flexibility in programmable logic integrated circuits. For example, the memory ports should be configurable to meet the requirements of the application designed in the programmable logic. Specifically, the memories should have configurable input and output data word widths. This is true particularly in networking and DSP applications. But this flexibility should not come at the expense of circuit complexity, die area, or power dissipation. Also, for greatest flexibility, the memory should be a true dual-port, capable of either reading or writing from both ports at the same time.

What is needed is a highly flexible memory, with independently configurable dual read and write ports.

SUMMARY OF THE INVENTION

An exemplary embodiment of the present invention provides a dual-port SRAM in a programmable logic device. The dual-port SRAM has configurable input and output data word widths. To accomplish this, conforming logic is placed in front of conventional write column and read column address decoders, and multiplexing circuits are inserted in the write and read data paths. The conforming logic and multiplexing circuits are controlled by data bits stored in a configuration RAM. These bits are referred to as CRAM bits.

Another exemplary embodiment of the present invention provides a method of writing to a memory. The method includes receiving an address portion having a first number of address bits. A second number of address bits of the address portion are blocked, where the second number is less than the first number. A third number of address bits are not blocked; the third number plus the second number equal the first number. The third number of address bits are decoded, and a fourth number of memory cells are selected. The fourth number is equal to two to the power of the second number. A fourth number of data bits are received and multiplexed to the selected memory cells. The data bits are then written to the selected memory cells.

A further exemplary embodiment of the present invention provides a method of reading from a memory. The method includes receiving an address portion including a first number of bits, blocking a second number of bits of the address portion, the second number less than the first number, and passing a third number of bits of the address portion. The third number summed with the second number is equal to the first number. A fourth number of data bits are read from a fourth number of memory cells, and the third number of bits are decoded in order to multiplex a first number of data bits to a fifth number of outputs.

Another exemplary embodiment of the present invention provides an integrated circuit. The integrated circuit includes an address conforming logic block configured to receive a first number of address bits, block a second number of address bits, and pass a third number of address bits. Also included are an address decoder coupled to the address conforming logic block configured to decode the third number of address bits and provide a fourth number of column select signals, and a memory array having memory cells arranged in rows and columns, configured to receive the fourth number of column select signals.

Yet a further exemplary embodiment of the present invention provides an integrated circuit. This integrated circuit includes an address conforming logic block configured to receive a first number of address bits, block a second number of address bits, and pass a third number of address bits. Also included are an address decoder coupled to the address conforming logic block configured to decode the third number of address bits and provide a fourth number of column select signals, a memory array having memory cells arranged in rows and a fifth number of columns, and a fifth number of sense amplifiers coupled to the memory array, configured to provide a fifth number of read data bits.

A further exemplary embodiment provides an integrated circuit. This integrated circuit includes a memory array having a plurality of memory cells arranged in rows and columns, address configuration means for receiving a plurality of address bits including a first portion of address bits and a second portion of address bits, blocking the first portion of address bits, and providing the second portion of address bits. Also included are an address decoder means for receiving the second portion of address bits and providing a plurality of select lines. The plurality of select lines selects a plurality of columns of memory cells in the memory array. Also included is a data multiplexer means for receiving a plurality of data bits and the plurality of select lines, and multiplexing the plurality of data bits to the plurality of columns of memory cells in the memory array.

A further exemplary embodiment provides another integrated circuit. This integrated circuit includes a memory array having a plurality of memory cells arranged in rows and columns, sense amplifier means for reading data from the columns of memory cells in the memory array and providing a plurality of read data bits, and address configuration means for receiving a plurality of address bits comprising a first portion of address bits and a second portion of address bits, blocking the first portion of address bits, and providing the second portion of address bits. Also include are an address decoder means for receiving the second portion of address bits and providing a plurality of select lines, and data multiplexer means for receiving the plurality of read data bits and the plurality of select lines, and multiplexing a first portion of the plurality of read data bits to a plurality of output data lines.

A better understanding of the nature and advantages of the present invention may be gained with reference to the following detailed description and the accompanying drawings.

BRIEF DESCRIPTION OF THE DRAWINGS

FIG. 22 shows simplified schematics of exemplary conforming logic and decoder, along with their associated truth tables and equations;

DETAILED DESCRIPTION

Figure 1:
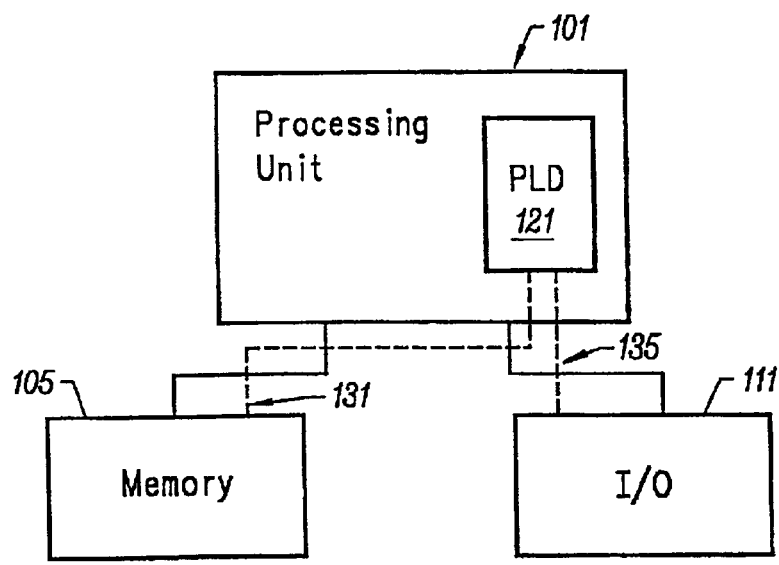
FIG. 1 is diagram of a digital system with a programmable logic integrated circuit.

FIG. 1 shows a block diagram of a digital system within which embodiments of the present invention may be employed. The system may be provided on a single board, on multiple boards, or within multiple enclosures. FIG. 1 illustrates a system 101 in which a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258, 668, 5,260,610, 5,260,611, 5,436,575, and the Altera Data Book (1999), all incorporated by reference in their entirety for all purposes. Programmable logic integrated circuits and their operation are well known to those of skill in the art.

In the particular embodiment of FIG. 1, a processing unit 101 is connected to a memory 105 and an I/O 111 and incorporates a programmable logic device (PLD) 121. PLD 121 may be specially connected to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
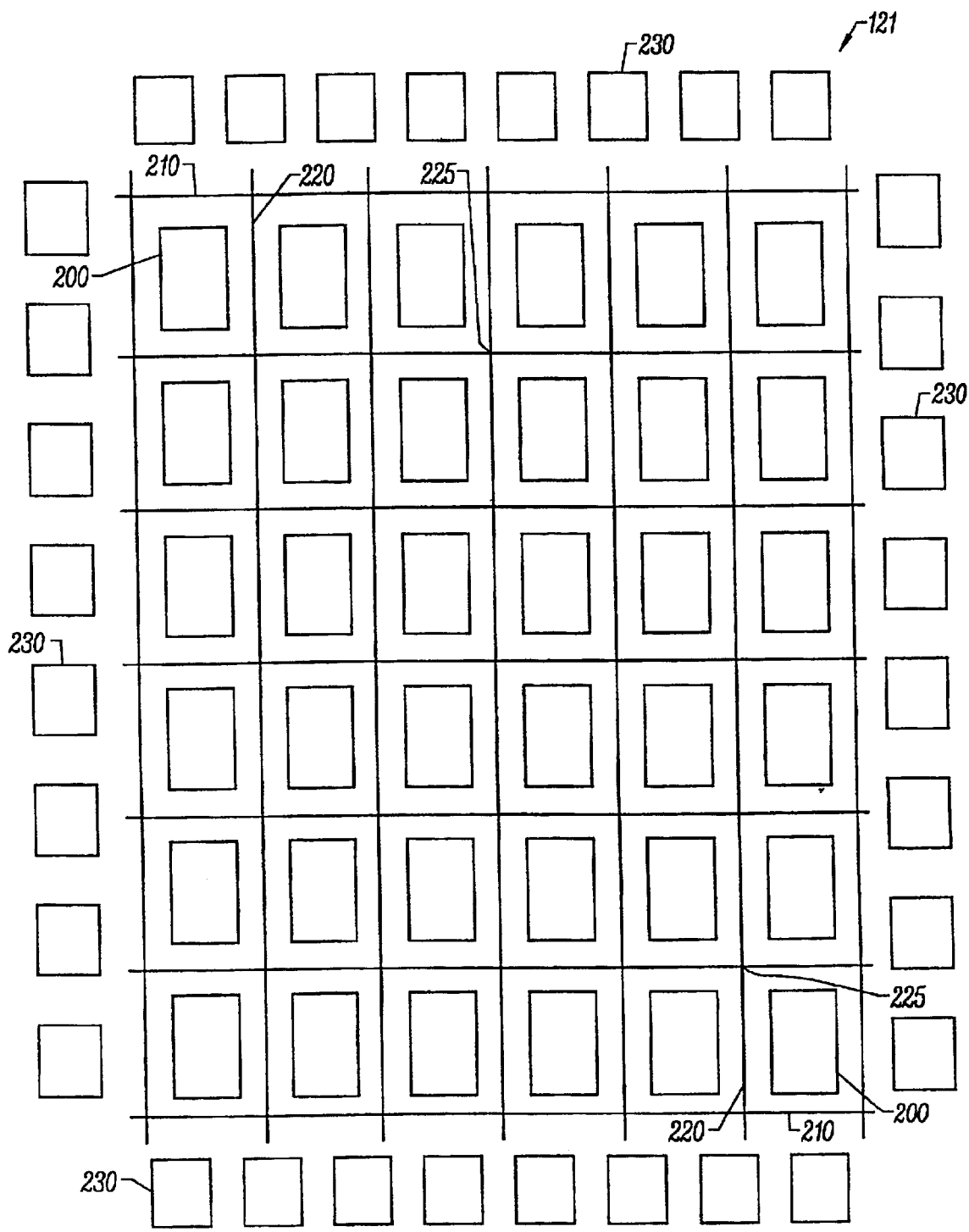
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention, and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 3:
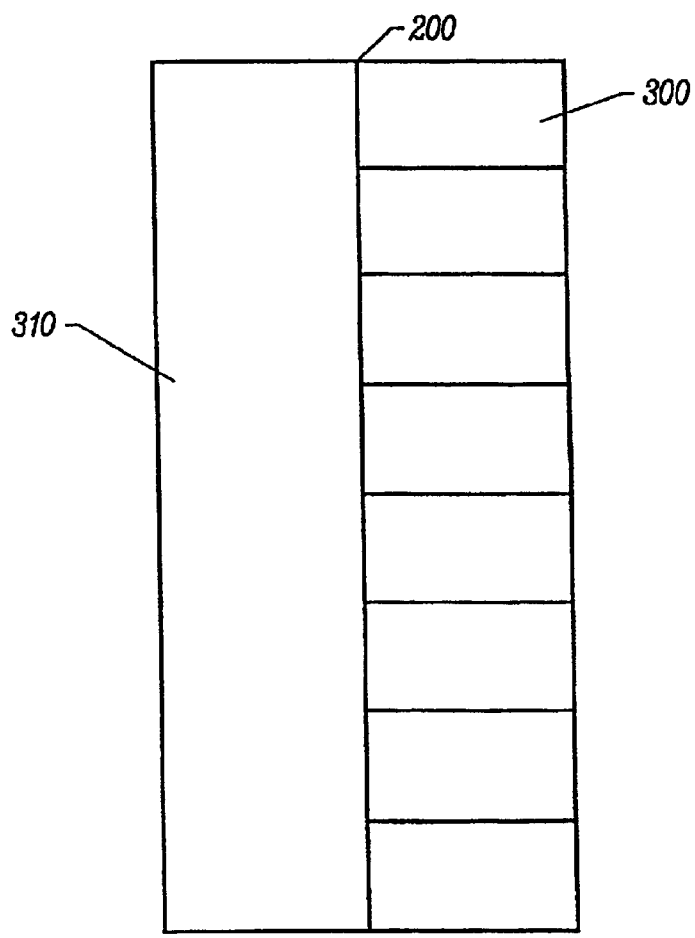
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. Signals external to the LAB, such as from GHs 210 and GVs 220, are prograrmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programnably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
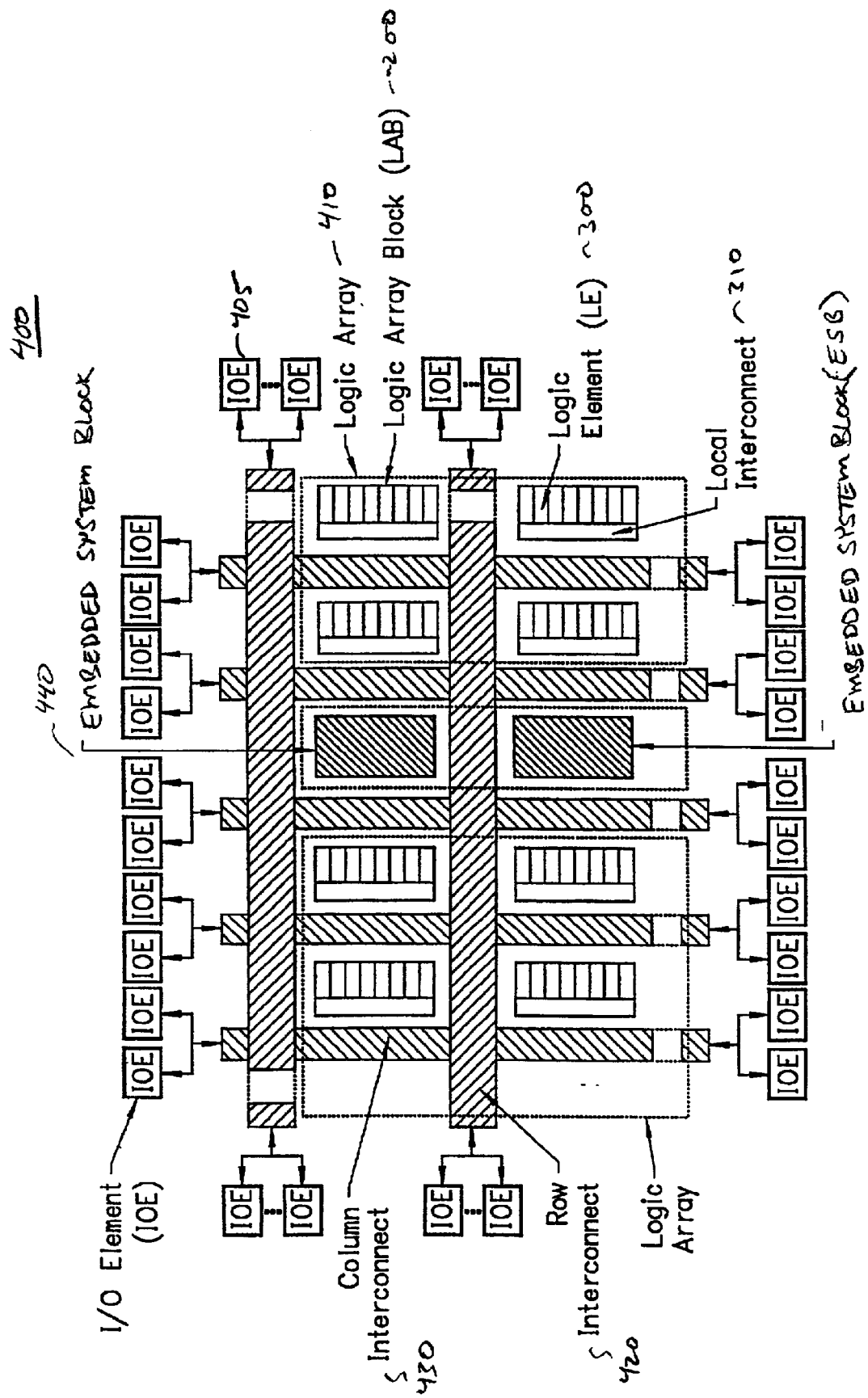
FIG. 4 shows an architecture of a programmable logic integrated circuit with embedded system blocks (ESBs)

FIG. 4 shows a PLD architecture similar to that in FIG. 2. The architecture in FIG. 4 further includes embedded system blocks (ESBs), or embedded array blocks (EABs). ESBs contain user memory, a flexible block of RAM. More discussion of this architecture may be found in the Altera Data Book (1999), and also in U.S. Pat. No. 5,550,782, which are incorporated by reference.

Figure 5:
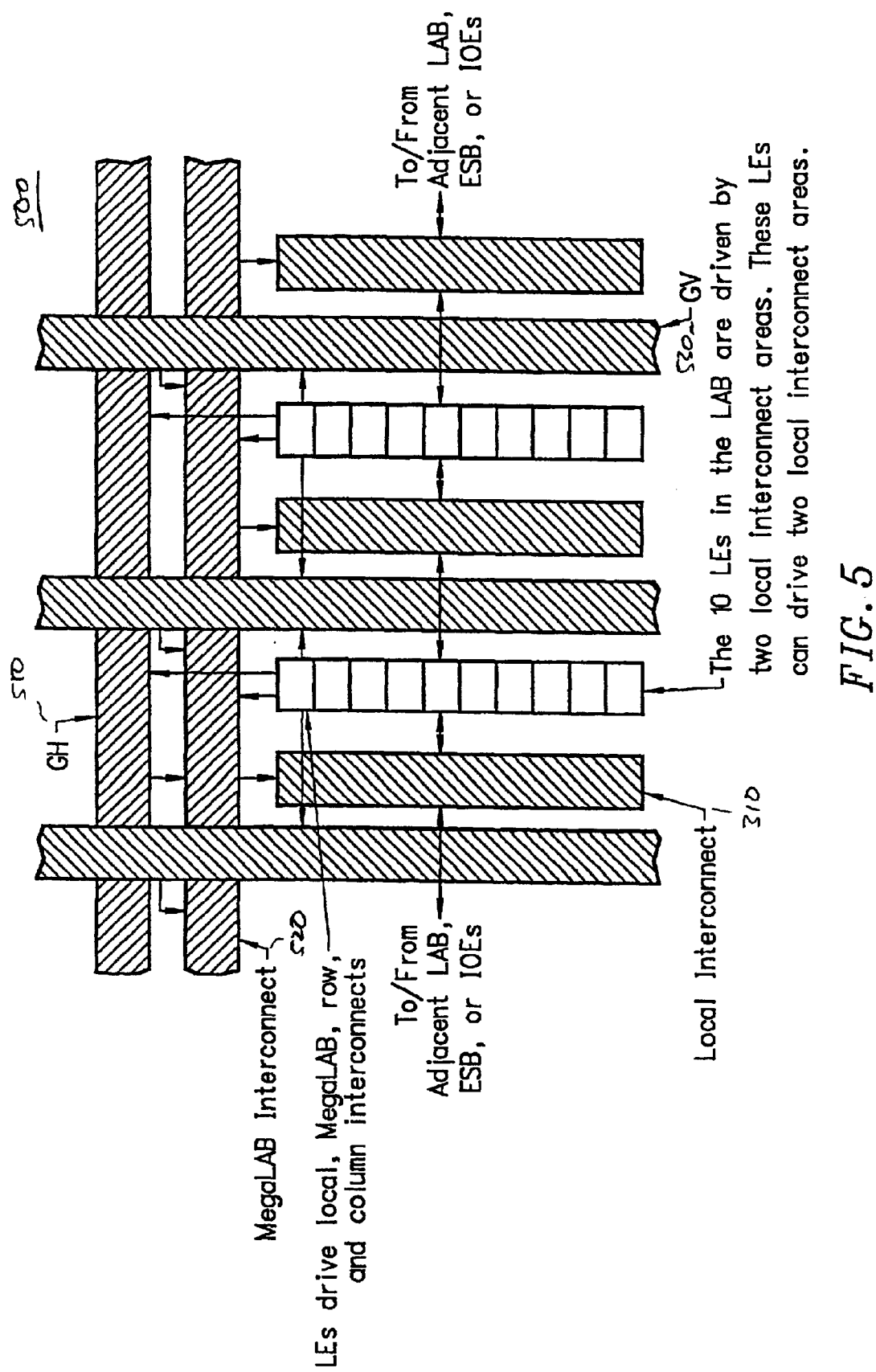
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the mega- LAB. Compared to the architecture of FIG. 2, this architecture has an additional level of interconnect, the megaLAB interconnect. Such an architecture is found in Altera's APEX™ family of products, which is described in detail in the APEX 20K Programmable Logic Device Family Data Sheet (August 1999), which is incorporated by reference. In a specific implementation, a megaLAB also includes an embedded system block (ESB) to implement a variety of memory functions such as CAM, RAM, dual-port RAM, ROM, and FIFO functions.

Figure 6:
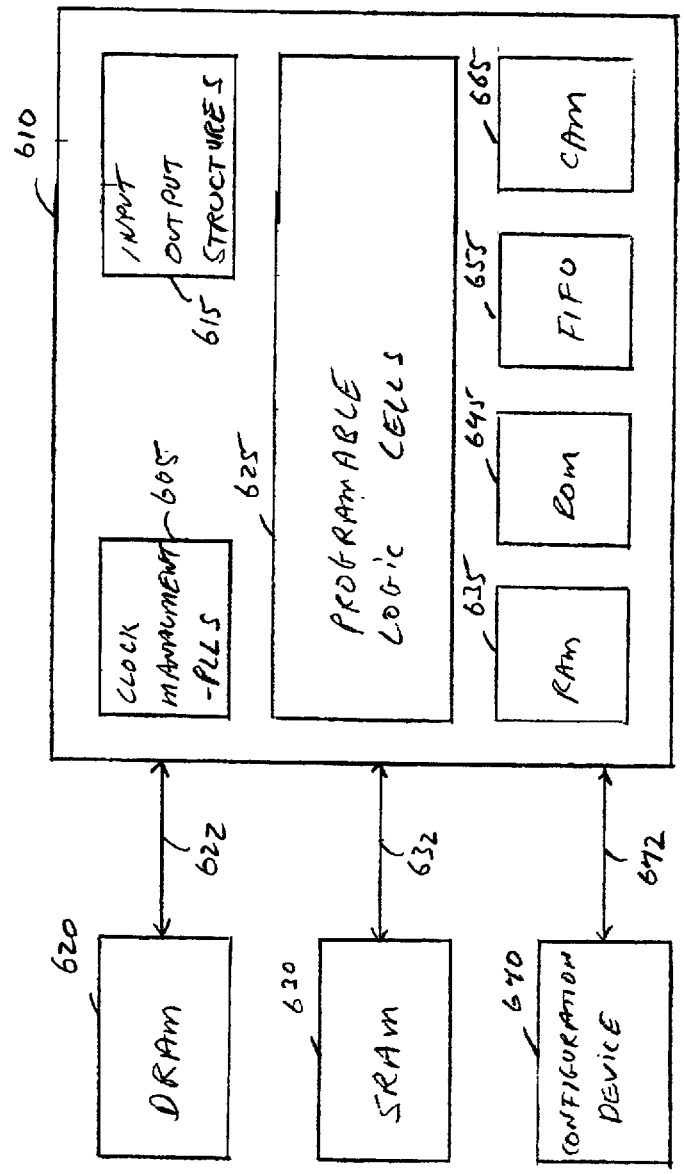
FIG. 6 is a block diagram of an electronic subsystem.

FIG. 6 is a block diagram 600 of an electronic subsystem. Included are programmable logic device 610, DRAM 620, SRAM 630, and configuration device 640. The DRAM 620 communicates with programmable logic device 610 using bus 622. SRAM 630 and configuration device 640 communicate with programmable logic device 610 using buses 632 and 642. Programmable logic device 610 includes a clock management block 605 made up of phase-locked loops (PLLs) and related circuitry, input output structures 615, programmable logic cells 625, and embedded system blocks 635–665, which may be configured into various memory types. These memory configurations may include a static random access memory (SRAM) 635, a read only memory (ROM) 645, first-in-first-out (FIFO) 655, or a content addressable memory (CAM) 665. The memories may be single or dual-port. DRAM 620 provides extra memory off-chip for use by the programmable logic device 610. Similarly, SRAM 630 provides high-speed memory for programmable logic device 610. Configuration device 640 stores information as to the configuration of the clock management block 605, input output structures 615, programmable logic cells 625, and the memory blocks 635, 645, 655, and 665.

The locations of the various blocks of the programmable logic device 610, as shown in this figure, do not necessarily reflect the floor plan of these devices. While the clock management block 605 may be in a corner of the die for noise and coupling reasons, the input output structures 615 are often placed around the periphery of the device. Also, the embedded system blocks 635–665 are mixed with the programmable logic cells 625, such that the programmable logic cells 625 have easy access to the ESBs 635–665.

Figure 7:
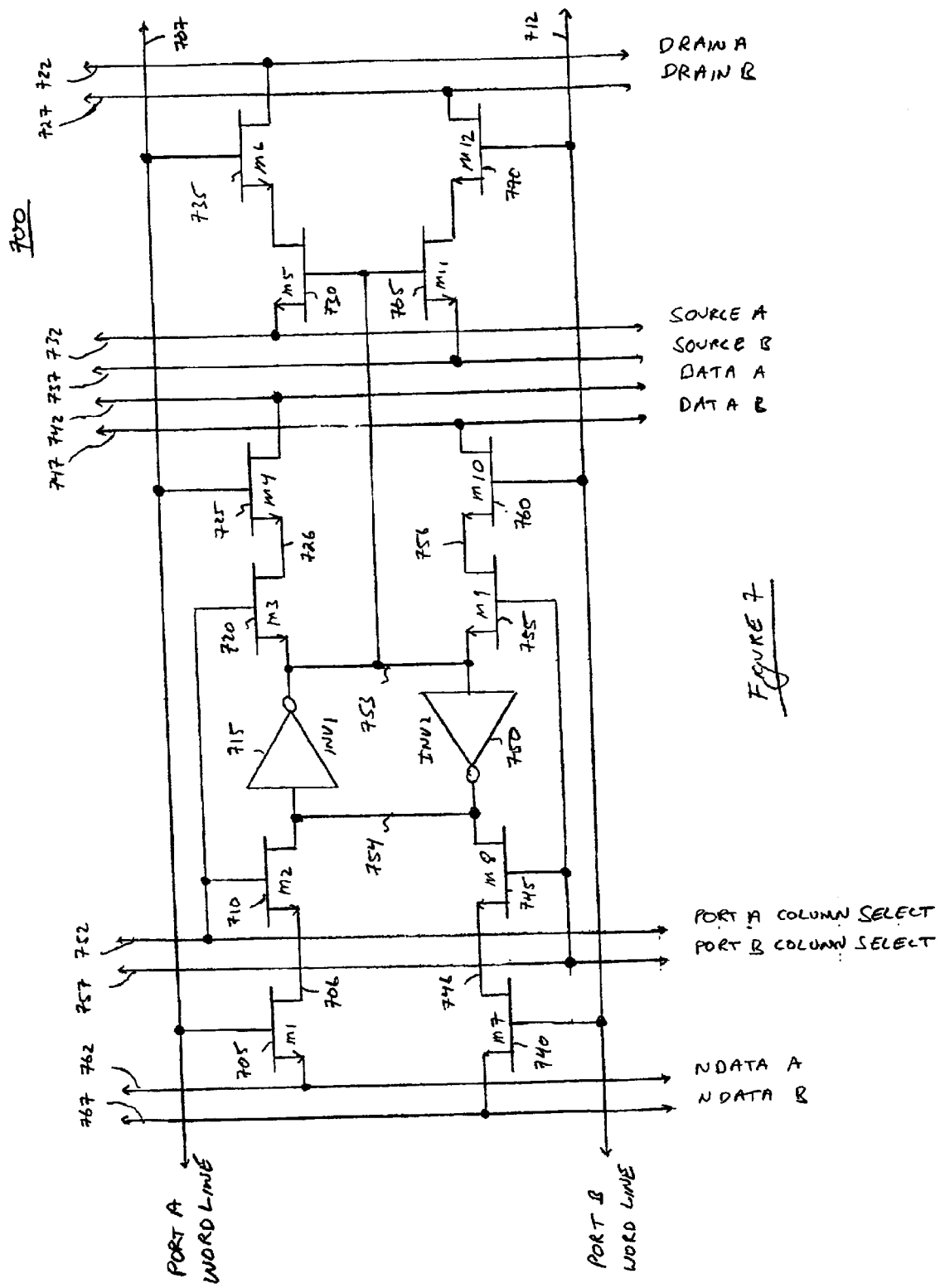
FIG. 7 is a schematic of a dual-port static random access memory (SRAM) storage cell circuit.

FIG. 7 is a schematic 700 of a dual-port static random access memory (SRAM) storage cell circuit. This SRAM storage cell may be used to achieve high noise immunity and to provide in addition to data storage of a RAM or ROM, multiple logic functions such as CAM, FIFO, LIFO, product terms (PT), and others. This SRAM cell significantly reduces charge sharing between bit lines and internal storage nodes in operation.

Included is a memory cell with its dual-port read and write circuits and their interconnections, which may be used in an embedded system block configured in one of the memory types discussed. Included are a memory cell including a first inverter 715 and a second inverter 750, cross coupled with the first inverter 715. Connected to the memory cell are differential data lines for Port A, Data A line 742 and N Data A line 762. Between the memory cell and the Data A line are series devices M3 720 and M4 725. Connected between the memory cell and the Data A line are devices M2 710 and M1 705. Devices M2 710 and M3 720 have gate electrodes tied to Port A column select line 752. Devices M1 705 and M4 725 have gates tied to Port A word line (or read/write word line) 707. Also connected to the memory cell is a separate read port including inverter device M5 730 in series with device M6 735. The gate of M6 735 is tied to Port A word line 707. Devices M5 730 and M6 735 are between a Source A line 732 and a Drain A line 722.

Read and write circuits for a second port, Port B are also connected to the memory cell. Series devices M9 755 and M10 760 are placed between the memory cell and a Data B line 745. Devices M8 745 and M7 740 are connected between the memory cell and N Data B line 765. The gates of M8 745 and M9 755 are tied to Port B column select line 757. The gates of M7 740 and M10 760 are tied to the Port B word line 712. A read circuit is included for Port B. Specifically, inverter device M11 760 is driven by the memory cell. M12 770 is in series with M11 765. The gate of M12 770 is connected to Port B word line 717. Devices M11 765 and M12 770 are connected in series between Source B line 735 and Drain B line 727.

Since there are two devices in series between the memory cell and the data lines, the memory cell is isolated from voltage switching on the data lines. For example, voltage spikes or glitches on a word line or column select line are not sufficient to allow transfer of a significant amount of charge between the data lines and the memory cell since there is a second device in series between the data lines and memory cell. Specifically, a glitch or spike on Port A column select line 752, which temporarily turns on or activates M2 710, is not enough to allow corruption of the memory cell data on line 754 by data line 762, since M1 705 is off or deactivated and in series with device M2 710. Moreover, the tendency in most applications is for a word line to remain selected as column lines are selected and deselected. This means that as device M2 710 is switched off and on in cells on deselected word lines, the memory cells are protected by off device M1 705.

A desirable feature for a SRAM cell is to allow read-during-write operation. In order to support "read-during-write" operations, and also simplify the decoding scheme, read and write word lines are shared. Specifically, the word lines are shared for the read and write circuits for both Port A and Port B. This eliminates two routing channels in the word line direction for each row, thus saving layout area. Also, word line decoding is simplified, since one decoder is used in place of separate read and write decoders. Moreover, having separate read and write circuits, and sharing a word line facilitates read-during-write operations. That is, the read circuit allows data to be read from the memory cell while other data on the Data and N Data lines is being written to the cell by the write circuit. Since the word line is in common, both read and write circuits are selected. Also, since the write enable is an input to the column decoder instead of the word line decoder, the word line of a cell is active when that row is selected, even if the write is disabled. If the same address is reaccessed, the word line is already active, and the read delay is reduced.

According to a probability study of memory used in a microprocessor-based system, the address of the most recent visited row has the highest chance to be revisited in the next cycle. This is the basic principle behind memory caching. Accordingly, the sharing of word lines between the read and write circuits has a minimum affect on system performance. On the other hand, by sharing a word line between read and write circuits, the memory architecture is optimized, and extra bypass circuitry needed to provide the feature of read-during-write is eliminated. If the next instruction requires reaccessing the same address that has just been updated, the new data is available at the output of memory before the next cycle.

This memory cell receives a differential write data signal. That is, data to be written to Port A is placed on Data A line 742, and its complement on N Data A line 762. Data to be written to Port B is sent on Data B line 747, and its complement on N Data B line 767. This differential write decreases the time required to write to a memory cell. Data placed on the Data lines passes through the series devices to the memory cell. Since it is differential, the longest delay is through one inverter. If the write was instead single-ended to the input of the first inverter 715, and the polarity of the data was being changed, the cell would not stabilize until the first inverter transitioned, causing the second inverter to change state. Since each inverter is driven in this differential configuration, the cell stabilizes after the first inverter changes state, since the second inverter changes at the same time.

The devices in the read and write circuits are shown as NMOS devices. Alternately, the devices may be PMOS, with appropriate signal polarity changes, or a mix of NMOS and PMOS. Alternately, the devices may be bipolar, GAs, or any other suitable type device. The devices are shown as NMOS for illustrative purposes only, and as with all the figures shown, do not limit the scope of the invention, or the appended claims.

Figure 8:
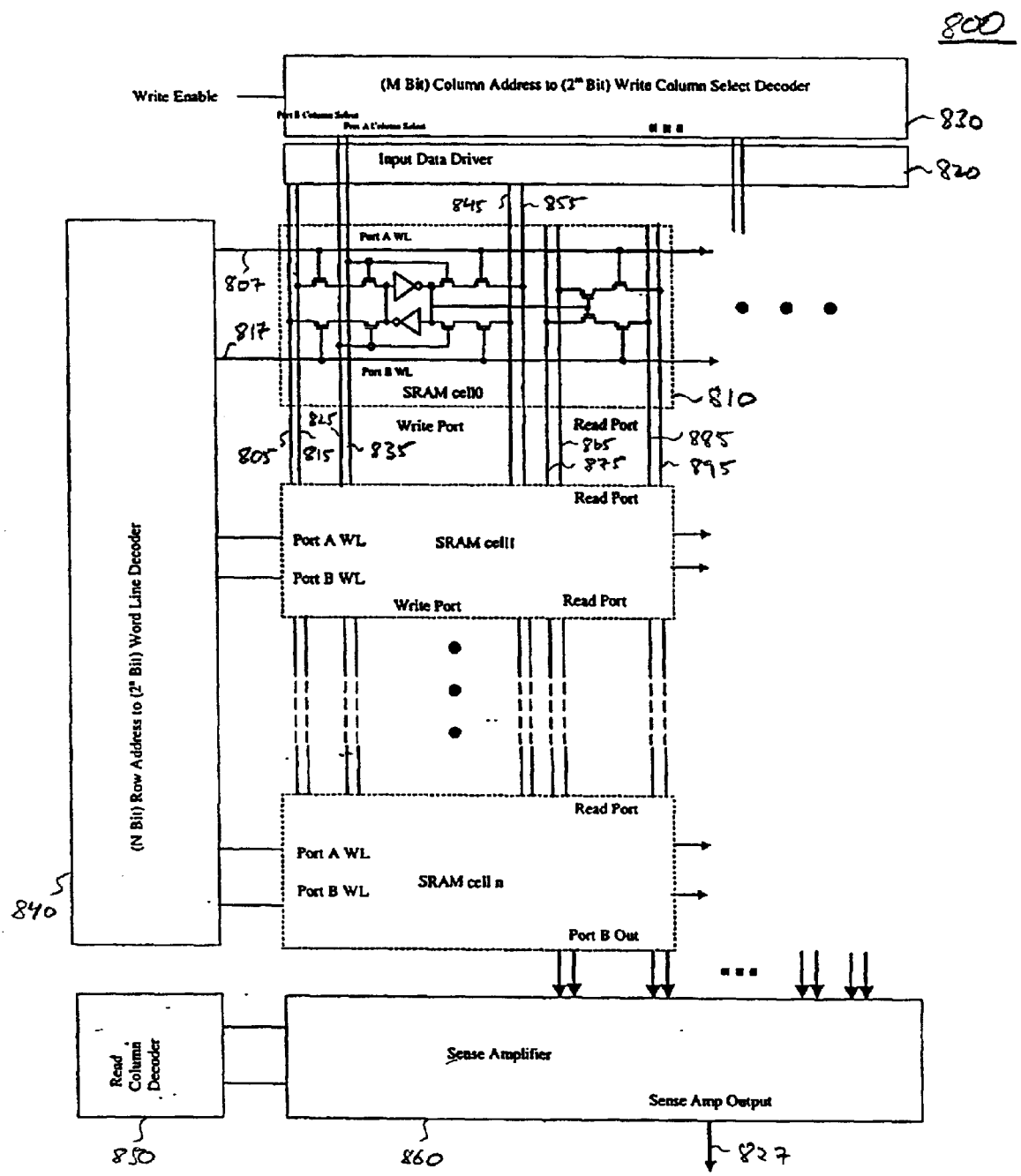
FIG. 8 is a simplified block diagram of a memory in an embedded system block in a programmable logic device according to an embodiment of the present invention.

FIG. 8 is a simplified block diagram 800 of a memory in an embedded system block in a programmable logic device according to an embodiment of the present invention. Included are a plurality of SRAM cells 810, input data driver 820, column decoder 830, row address word line decoder 840, read column decoder 850, and sense amplifiers 860. In one embodiment of the present invention there are 32 columns for a total of 32 memory cells on each word line. In this embodiment, there are 128 memory cells in the vertical direction as indicated in the figure, for a total of 4096 cells. That is, there are 128 rows of memory cells, with two word lines connected to each row. Alternately, other numbers of columns, word lines, and total cells may be used.

A number M bits of an address are decoded by column decoder 830. A write enable signal is input to the write column select decoder 830. Differential write data is provided to the memory cells 810 by input data driver 820. A number N bits of the address are decoded by word line decoder 840 and used to select word lines connected to the memory cells. Read column decoder 850 couples the sense amplifiers to the SRAM cells to be read, and sense amplifiers 860 output data on sense amplifier output lines 827.

In an embodiment of the present invention, the input data word is variable, and determined by the write column select decoder. Thus, write column select signals define the desired word size, and thus the number of memory cells to be accessed in write operations in different applications. The write column select is an address control line other than the word line decoder, and it sets the size of data to be written to a row.

A write enable signal may sent to either the word line decoder, or the write column decoder. Not having the write enable as an input to the word line decoder results in the reduction of the complexity of the word line decoder and shortens the word line wire delay. The write enable signal is not merely for disabling a normal write, and can be defined as any means that protects or isolates a row or part of a row from being written to. By placing the write enable input in the write column select decoder 830, word lines are selected even when no write operation is to take place. Again, this speeds the read operation, if a read follows this "non-write" operation. Also, in one embodiment, there are 32 columns, two column select lines for each column, one for each port, for a total 64. There are 128 rows, two word lines per row, totaling 256 word lines. Accordingly, disabling all word lines requires driving 256 inputs, while disabling the column select lines requires driving only 64. Thus, the required circuitry is simplified, at least in this example, if the column select circuitry receives the write enable input.

In an embodiment of the present invention, additional circuitry is included such that the memory may be configured as a content addressable memory (CAM). In one embodiment, the CAM uses 32 columns, and 64 word lines. One port of the memory is used, so the 64 word lines correspond to 64 rows of memory cells. The 64 rows are grouped into pairs or rows, with odd rows and neighboring even rows grouped together, specifically the first and second, the second and third, and so on. In a CAM, a data entry, for example a password, is stored. A data word, the comparand is entered. If there is a correspondence between the comparand and a data entry, a match is generated, otherwise there is a miss.

Specifically, in FIG. 8, a data entry is stored in the odd memory cells in a column. A complement of the data entry is stored in the even memory cells in the column. Since in this example there are 32 columns, 32 data entries and their complements may be stored in this way. A comparand is then input to the word lines. In this CAM configuration, the usual word line decoder circuitry is bypassed, and comparand data inputs couple directly to the word lines. Specifically, the comparand data drives the even word lines, and a complement of the comparand data drives the odd word lines. In various embodiments of the present invention, the odd and even memory cells may be reversed, and the number of entries may be different.

The parallel impedance of the read cells in each column is then determined. If the impedance is high, there is a match, if the impedance is low, there is a miss. This means that for a match, each of the read cells in the column have a high impedance. This is because if only one impedance is low in a parallel combination, the impedance of the parallel combination is low. There are two devices in series in each read cell, an inverter device M5 730 and word line device M6 735. When a word line is selected, the word line device M6 735 is activated. That is, its gate is pulled high, and since in this example it is an N-channel or NMOS device, it may conduct. Whether an activated device actually conducts depends on the voltage at its source and drains relative to its gate and each other. Thus, for the impedance to be high in a selected read cell, the data stored at the memory cell node 753 is low, shutting off or deactivating M5 730. In this procedure, the data entry is stored in memory cells connected to word lines driven by the complement of the comparand, and the complement of the data entry is stored in word lines driven by the comparand. Thus, if there is a match between the data entry and the comparand, each selected word line drives a memory cell that is storing a low, and each memory cell that is storing a high, has an inactive word line. In this way, a match is detected by the high impedance of all the read cells in the column. Since each column has a sense amplifier, a simultaneous determination of whether there is a match is made between the comparand and each of the data entries.

Also, decoder circuitry is included in the sense amplifier block 860 in one embodiment of the present invention. Thus, if a sense amplifier reads a high impedance, the location of that sense amplifier is decoded, and output as a binary word. Specifically, a 5 bit binary word is output in this example, since there are 32 data entries, one per column, and 32 sense amplifiers. In various embodiments, the location of the lowest column, the highest column, or all the columns that have a match may be decoded.

In other embodiments, the CAM may have a different number of data entries, or not all data entries may be used.

The size of the data entries may vary. The devices in the read cells may alternately be PMOS devices, bipolar devices, GAs or other such devices.

This memory may also be configured as a ROM, simply by not asserting the write enable signal. Also, it may be configured as a FIFO or LIFO (last-in-first-out). For these, a counter is made of surrounding programmable logic cells, and the counter controls the word line decoder. In a typical embodiment, the memory is an SRAM.

Figure 9:
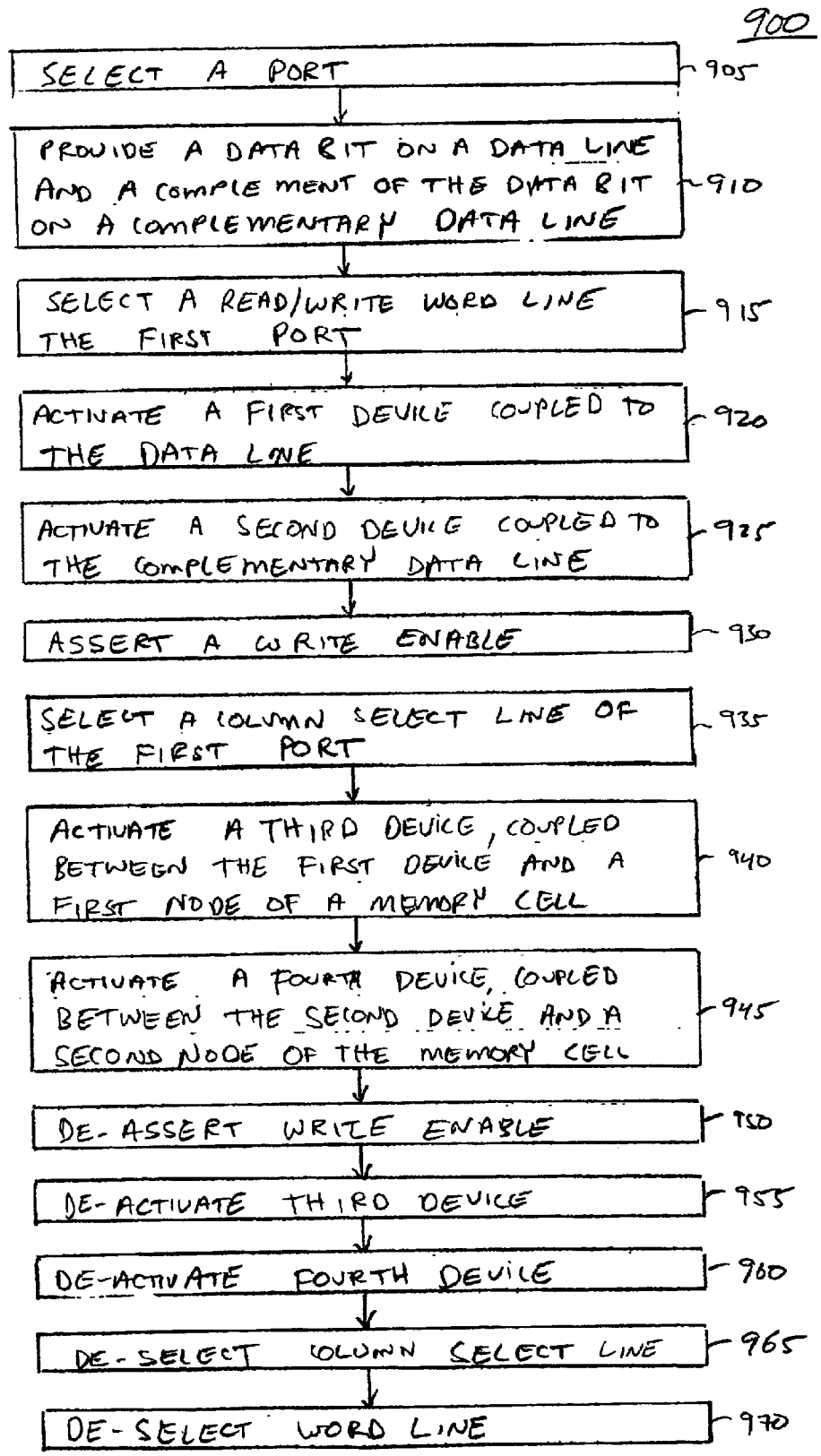
FIG. 9 is a flowchart of a method of writing to a dual-port SRAM cell consistent with an embodiment of the present invention.

FIG. 9 is a flowchart 900 of a method of writing to a dual-port SRAM cell consistent with an embodiment of the present invention. In act 905, a port is selected. In act 910, a data bit is provided on a data line and a complementary data bit is provided on a complementary data line. In act 915, a read/write word line is selected. A first device connected to the data line and a second device connected to the complementary data line and are activated in acts 920 and 925. In act 930, a write enable is asserted, and a column select line is selected in act 935. A third device connected between the first device and a first node of the memory cell is activated in act 940, and a fourth device connected between the second device and a second node of the memory cell is activated in act 945. At this time the memory cell is written to. The write enable signal is the asserted in act 950, which deactivates the third device and the fourth device in acts 955 and 960. In act 965, the column select line is deselected, and the word line is deselected in act 970.

Figure 10:
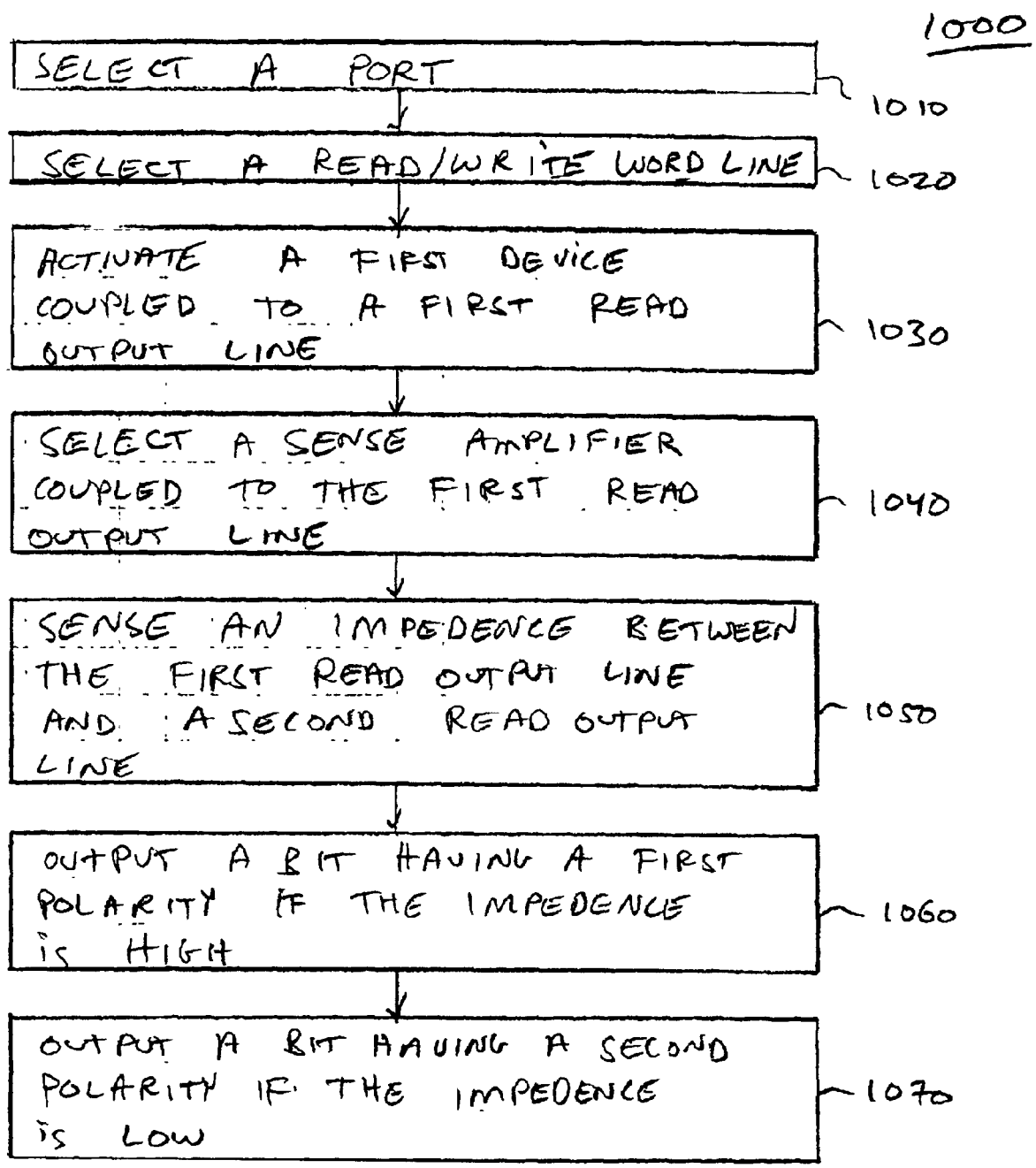
FIG. 10 is a flowchart of a method of reading data from a dual-port SRAM cell.

FIG. 10 is a flowchart 1000 of a method of reading data from a dual-port SRAM cell consistent with an embodiment of the present invention. In act 1010, a port is selected. In act 1020 a read/write word line is selected, and in act 1030 a first device connected to a first read output line is turned on. In act 1040, a sense amplifier is selected and connected to the first read output line. An impedance is sensed between the first read output line and a second read output line in act 1050. A bit having a first polarity is output if the impedance is high, and a bit having a second polarity is output if the impedance is low, in acts 1060 and 1070.

Figure 11:
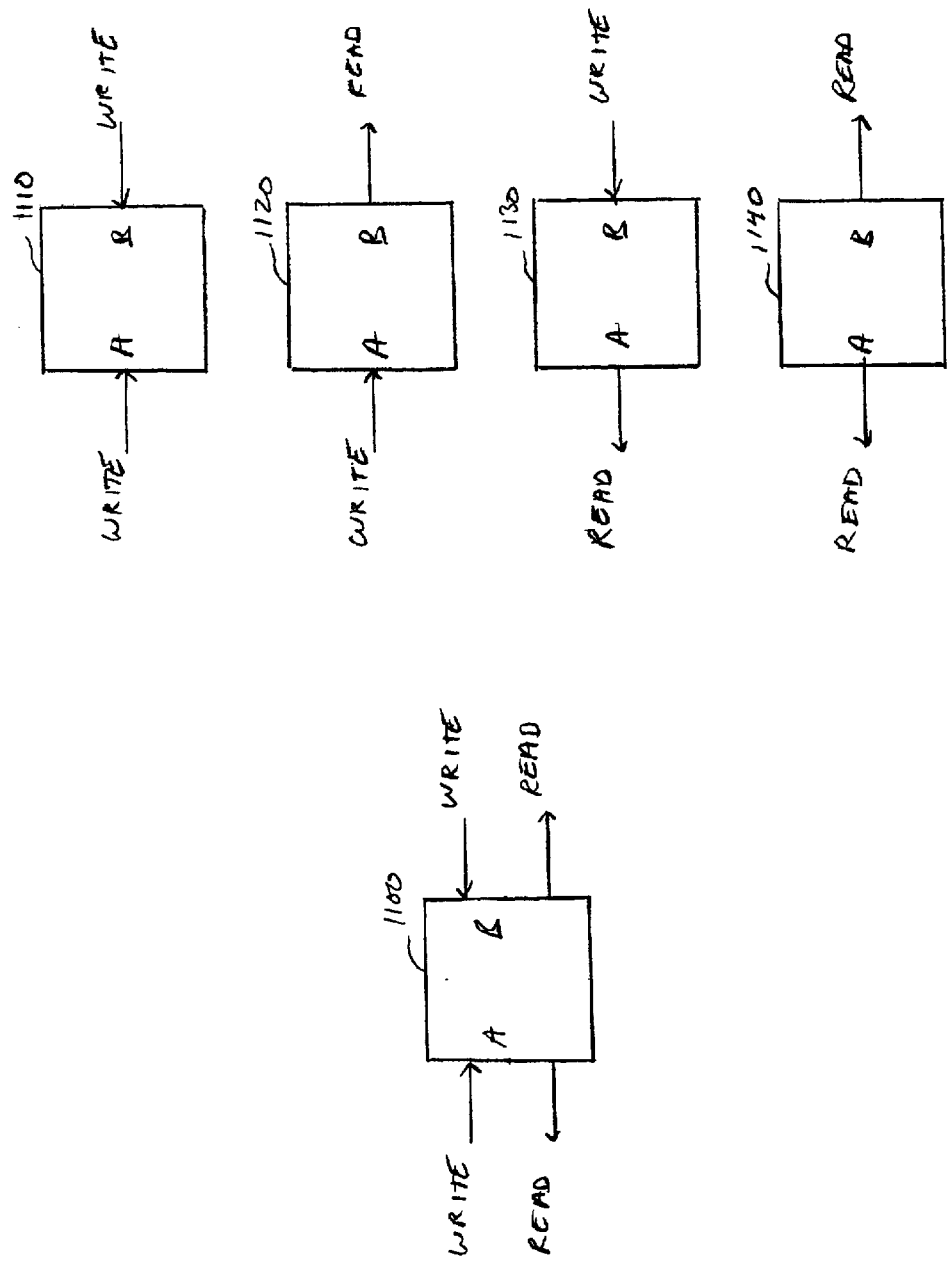
FIG. 11 is a diagram showing the possible read and write operations combinations for a memory consistent with an embodiment of the present invention.

FIG. 11 is a diagram showing the possible read and write operations combinations for a memory consistent with an embodiment of the present invention. Memory 1100 has Ports A and B, each port having an individual read and write port. This enables a write to be performed at once at both Ports A and B of memory block 1110. Alternately, a write may be simultaneously performed at Port A and a read performed at Port B of memory block 1120. Further, a read may be completed at Port A while a write is taking place at Port B of memory block 1130. Also, a read may simultaneously take place at both Ports A and B of memory block 1140.

Figure 12:
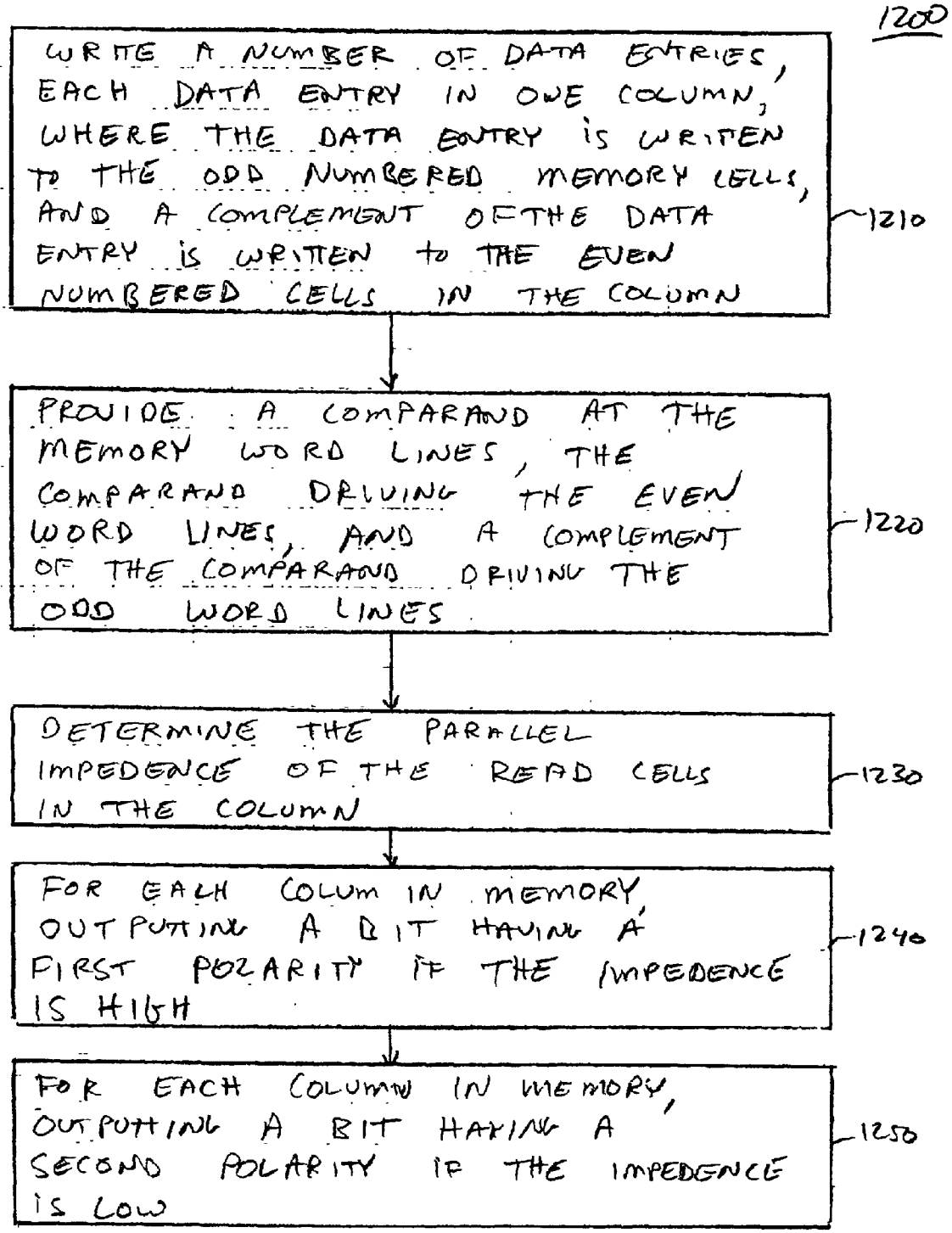
FIG. 12 is a flowchart of a method of operation of a memory according to the present invention configured as a CAM.

FIG. 12 is a flowchart 1200 of a method of operation of a memory according to the present invention that is configured as a CAM. In act 1210, a number of data entries are written. Each data entry is written to one column. The data entry itself is written to the odd numbered memory cells and a complement of the data entry is written to the even numbered cells. In acts 1220, a comparand is provided at the memory word lines. The comparand drives the even numbered word lines, and a complement of the comparand drives the odd numbered word lines. In act 1230, the parallel impedance of the read cells in the column is determined. For each column where the impedance is high, a match has occurred, and a bit having a first polarity he is output in act 1240. For each column were the impedance is low, a bit having a second polarity, the second polarity opposite the first polarity, is output.

Figure 13:
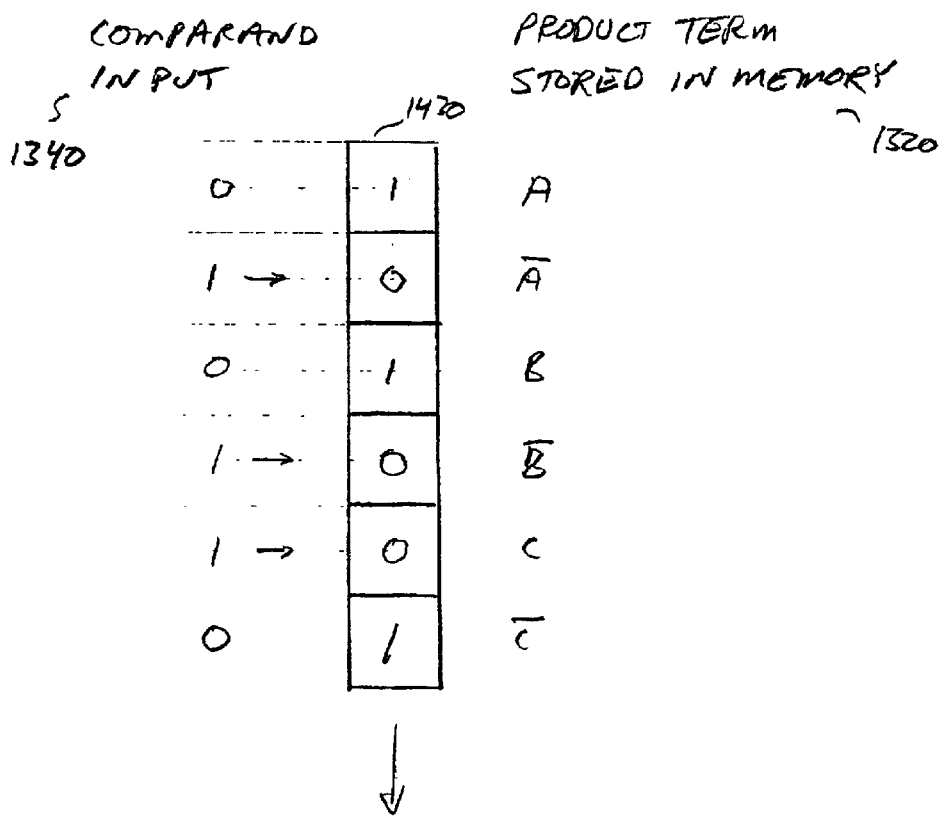
FIG. 13 is a diagram showing how a memory according to embodiments of the present invention, configured as a CAM, may be used to implement a product term.

FIG. 13 is a diagram 1300 showing how a memory according to embodiments of the present invention, configured as a CAM, may be used to implement a product term. One or more product terms may be implemented, one product term per column. For example, the product term $A \cdot B \cdot \overline{C}$ 1405 may be implemented in one column of memory cells. The product term is written to the odd memory cells, while a complement of the product term can be written to the even cells. Specifically, a one is written to the first cell, a one is written to the third cell, and a zero is written to the fifth cell, while a zero is written to be second cell, a zero is written to the fourth cell, and a one is written to be sixth cell. Comparand input 1340 and its complement drive the word lines connected to these memory cells. A match occurs when the comparand inputs equal to 110, since when A=1, B=1, and C=0, then $A \cdot B \cdot \overline{C}=1$. In this case, a one drives the word lines connected to the second, fourth, and fifth memory cells, while a zero is the word line input for the first, third, and sixth cells. Accordingly, the first, third, and sixth cells are not selected, and their read cells remain in a high impedance state. The second, fourth, and fifth cells are selected, but since they have stored a zero, their read cells also remain in a high impedance state. Since there are cells in the column that are not used in the product term, they are either disabled, or have data written to them, and the comparand input adjusted accordingly, such that the unused read cells are in a high impedance state. In one embodiment, the product term $A \cdot B \cdot \overline{C}$ is implemented as $A \cdot B \cdot \overline{C} \cdot D \cdot E \cdot F \ldots$ where D, E, and F are forced to be a 1.

Again, in an embodiment of the present invention, the data input port is configurable to allow different sized data words. Since the number of bits in a data words is often smaller than the number of memory cells in a word line, the data words are multiplexed to various locations on a word line.

Figure 14A:
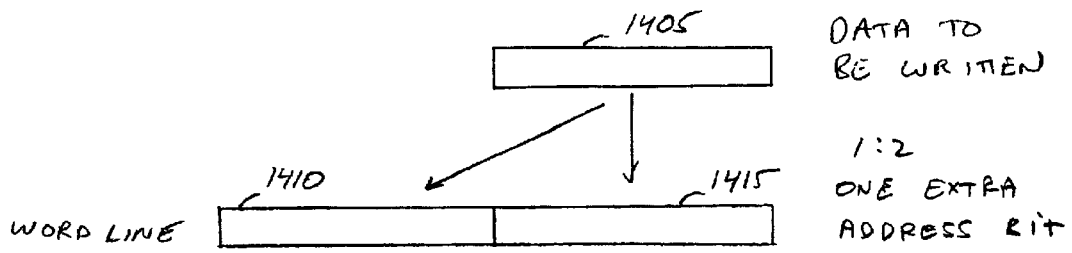
FIGS. 14A, 14B, and 14C, illustrate the multiplexing and shifting of bits at the data input of an exemplary memory consistent with embodiments of the present invention.
Figure 14B:
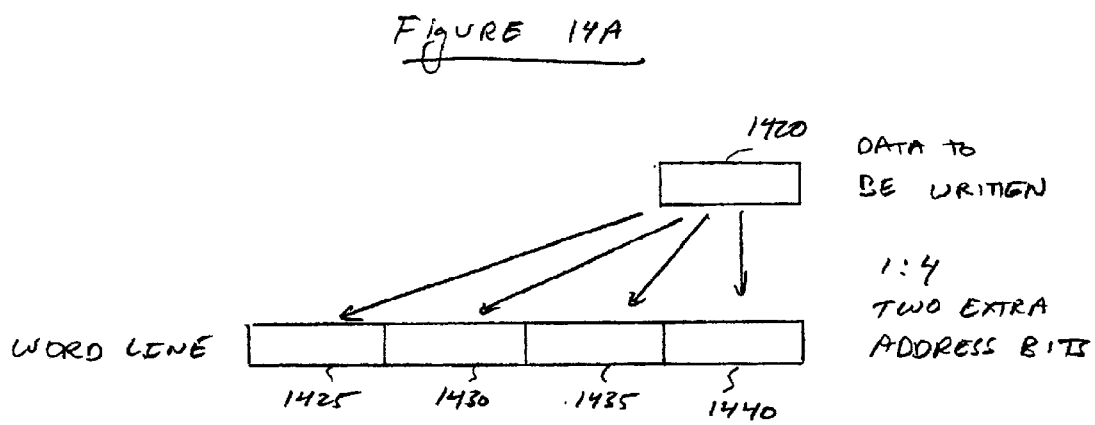
Figure 14C:
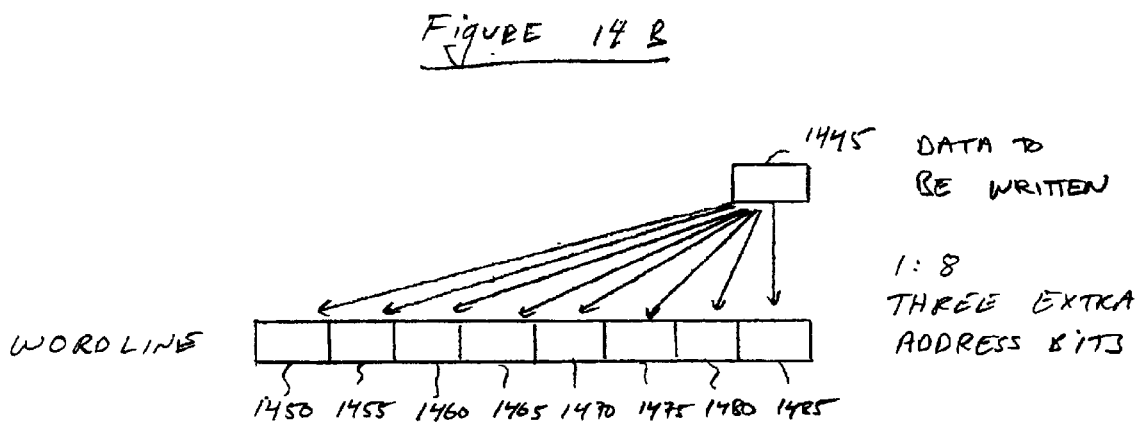

FIGS. 14A, 14B, and 14C, illustrate the multiplexing and shifting of bits at the data input of an exemplary memory consistent with embodiments of the present invention. In one embodiment, these tasks are controlled by the write column select decoder. FIG. 14A is an example of a word line made up of 32 bits, accepting data from a 16-bit wide data input 1405. Data word 1405 may be written either to word line portion 1410 or 1415. To determine this, one address bit is needed to select between the two word line portions. Similarly, multiplexing and shifting in the opposite direction occurs on a read.

FIG. 14B shows the multiplexing and shifting action performed by the data input circuitry when an 8-bit word 1420 is provided. The 8-bit word 1420 may be placed in word line portion 1425, 1430, 1435, or 1440. Two address bits are needed to determine which word line portion input word 1420 is to be written to, or read from.

FIG. 14C is an example of the multiplexing and shifting performed at the data input for a 4-bit wide word 1445. Four bit wide word 1445 may be stored in one of eight locations, labeled 1450 through 1485. Since there are eight possible locations, three address bits are required to make this determination. Two input wide words, and one input wide words can also be accepted, requiring four and five address bits respectively. In other embodiments, non-binary wide words may be accepted. Also, the width of the word line may vary in different embodiments.

Figure 15:
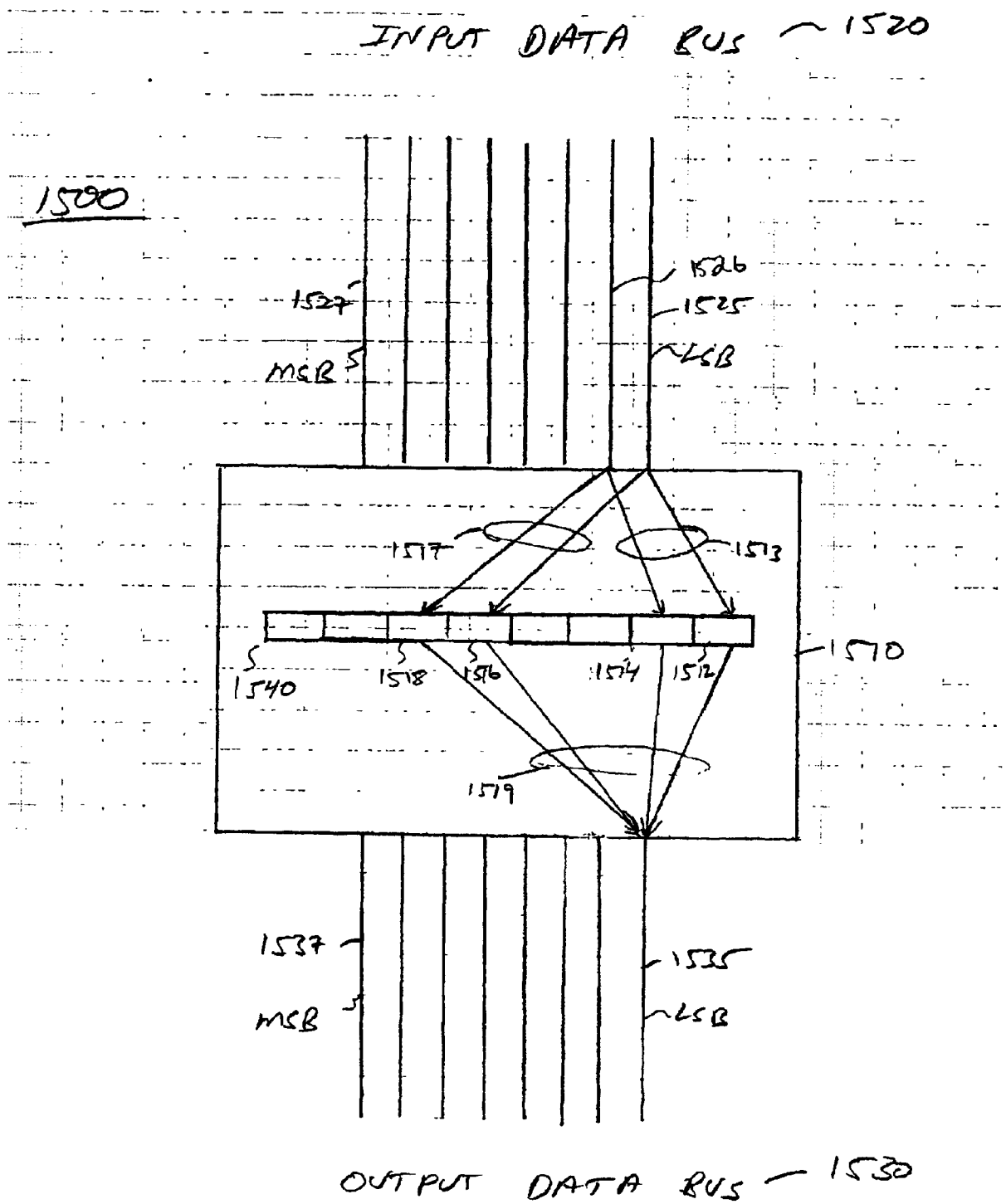
FIG. 15 is a diagram showing address selection, input multiplexing, and output multiplexing functions of a configurable memory consistent with an embodiment of the present invention.

FIG. 15 is a diagram 1500 showing the address selection, input multiplexing, and output multiplexing functions performed by an embodiment of the present invention. Included are a memory core 1510 having an input data bus 1520 and an output data bus 1530. In the example shown the input data bus is eight lines wide, and is capable of carrying eight data bits simultaneously. The input data bus 1520 has an LSB line 1525 and an MSB line 1527. The output data bus 1530 also has eight lines capable of carrying eight output data bits simultaneously. The output data bus 1530 has an LSB line 1535 and an MSB line 1537.

In this example, a selected word line 1540 having eight memory locations or memory cells is shown. If the input data word is eight bits wide, then each line of the input bus corresponds to one memory location, and the bit on each line of the input data bus can be written to a corresponding memory location. In some applications, it may be desirable for the input data word to be narrower than the corresponding input data bus 1520. In that case, to fully utilized the memory, the input data lines are multiplexed to different memory cell locations on the word line 1540. As an example, if the input data word is two bits wide, the data word may be provided to the memory on input data bus lines 1525 and 1526. This 2-bit wide word may be written to one of four locations in the eight memory cell word line 1540. Specifically, the data bits may be written to memory cells 1512 and 1514. Alternately, the data bits may be written to memory cells 1516 and 1518. When the data bits are written to memory cells 1512 and 1514, paths 1513 are used. When the data bits are written to memory cells 1516 and 1518, paths 1517 are used. In other examples, there may be a different number of input lines, output lines, and memory cells per word line. Alternately, other input or output lines may be used.

As is shown, the input data word may be the same or narrower than the width of the word line 1540. Two functions are provided by circuits associated with the memory cell array for write operations. First, address circuitry selects the proper memory cells, in this example, either memory cells 1512 and 1514, or memory cells 1516 and 1518. Second, input bits are routed from input lines 1525 and 1526 to the selected memory cells along either paths 1513 or paths 1517.

Similarly, the output data word may be the same or narrower than the width of the output data bus 1530. Further, the output data word may be a different width than the width of the input data word. In this example, the output data word is one bit in width, while the input word has a width of two bits. In this case, when data is read from memory cell 1512, 1514, 1516, or 1518, one of paths 1519 is used, and the data is output on line 1535 of the output data bus 1530. Again, two functions are provided by circuits associated by the memory cell array for read operations. First, one of the memory cells of word line 1540 is selected by the address circuitry. Second data from the selected one of the memory cells of line 1540 is multiplexed onto line 1535 of the output data bus 1530.

In an embodiment of the present invention, the memory is a dual-port memory. Alternately, the memory may be a single port, or other type memory. In a dual port memory, there may be two read ports and two write ports. The widths of the read ports may be configurable independently. Alternately, they may be limited to the same width, which may allow the use of one address conforming logic block instead of two. Also, the write ports may be independently configurable. Alternately, the may be limited to the same width for similar reasons. Again, the read and write ports may be independently configurable, as in this figure, or they may be limited to the same width.

Figure 16:
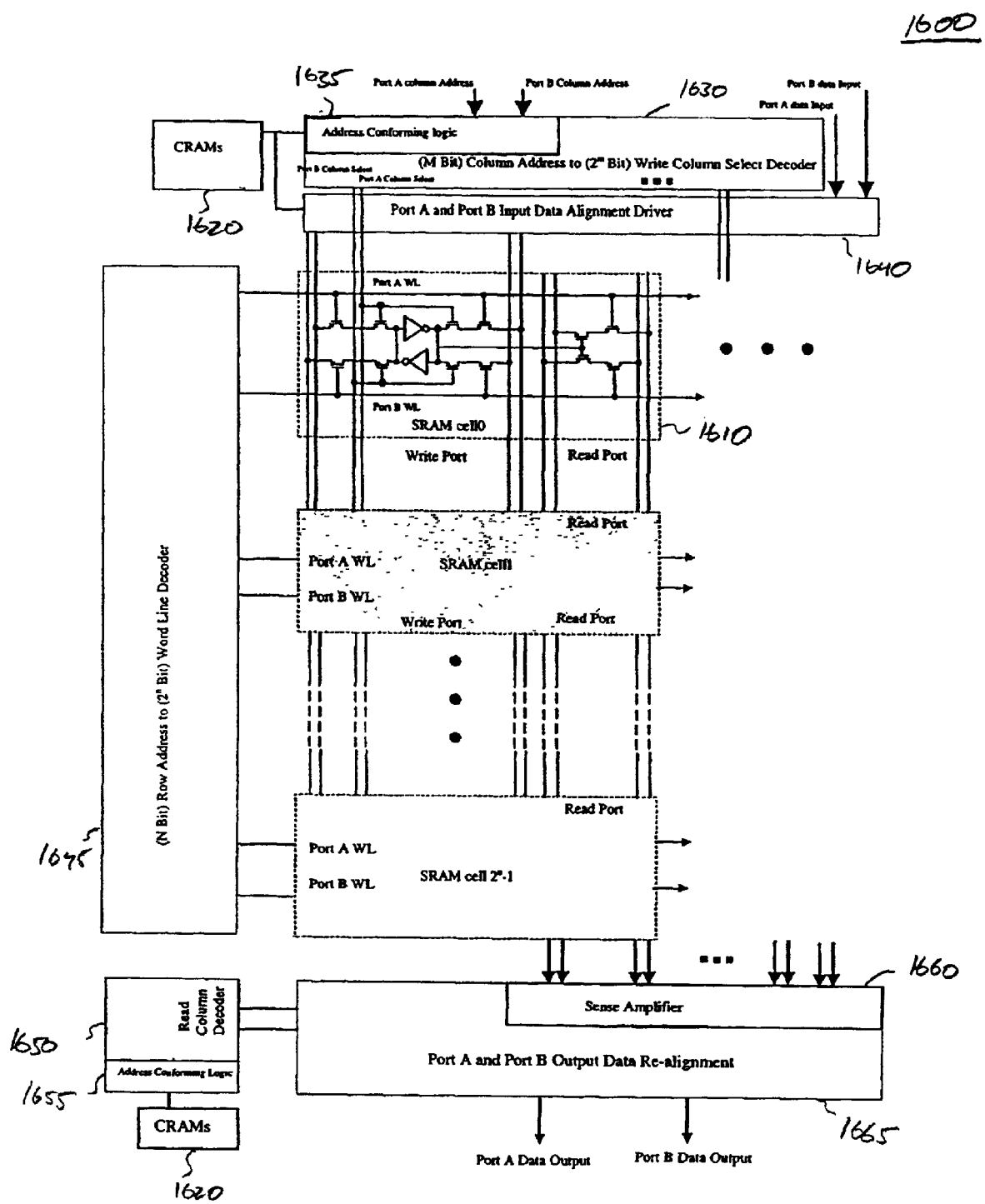
FIG. 16 is a block diagram of a memory block consistent with an embodiment of the present invention.

FIG. 16 is a block diagram 1600 of a memory in accordance with an embodiment of the present invention. Block diagram 1600 is similar to block diagram 800 shown in FIG. 8 above. Included are a plurality have memory cells 1610, a configuration random access memory (CRAM) 1620, write column select decoder 1630, address conforming logic 1635, input data alignment block 1640, word line decoder 1645, read column decoder 1650, read address conforming logic 1655, sense amplifiers 1660, and output data realignment block 1665. Write address conforming logic 1635 is included such that portions of a word line, corresponding to the width of an input data word, and equal to or less than the total number of columns in the array, may be selected. The data alignment block 1640 steers bits from the input data bus to the proper memory cells on a selected word line. Data realignment block 1665 steers data read from different memory cell locations along the selected word line to the correct lines of the output data bus. Read address conforming logic 1655 selects the proper memory cell columns for reading. Configuration RAM 1620 controls the address conforming logic blocks 1635 and 1655, as well as the data alignment and realignment blocks 1640 and 1665.

Figure 17:
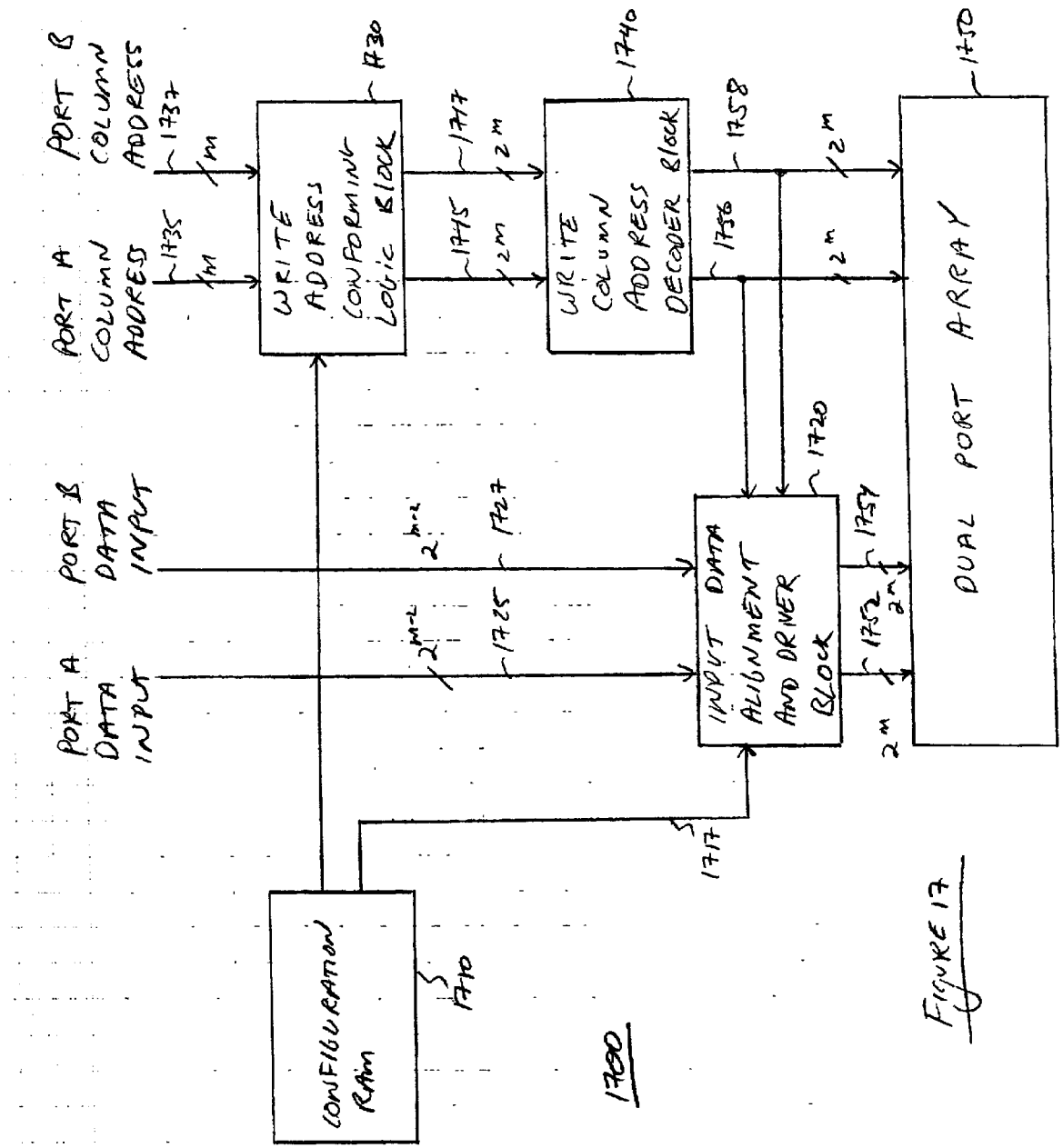
FIG. 17 is a block diagram of an exemplary address and data input circuitry used for writing data to a dual-port memory consistent with an embodiment of the present invention.

FIG. 17 is a block diagram 1700 of exemplary address and data input circuitry used for writing data to a dual-port memory consistent with an embodiment of the present invention. Though a dual port is shown, other memories may be used. For example, a single port memory, or a memory with more than two ports may be used. Included are a configuration RAM 1710, input data alignment and driver block 1720, write address conforming logic block 1730, write column address decoder block 1740, and dual-port memory cell array 1750.

A column address for Port A is provided on bus 1735, and a Port B column address is provided on bus 1737 to write address conforming logic block 1730. These column addresses can be a portion of a complete address. For example, a complete address may have row and column portions, where the row portion selects a word line, and the column portion selects a number of columns in the memory array 1750. Write address conforming logic block 1730 either blocks or passes each bit of the provided column addresses, and provides the results on buses 1715 and 1717 to the write column address decoder block 1740. The write column address decoder block 1740 decodes the conformed address information and selects a number of columns in the dual-port array 1750. Also, column select lines are output from the write column address decoder block 1740 and provided to the input data alignment and driver block 1720.

A first data word is input to Port A of the dual-port memory on bus 1725, and a second data word is input to Port B of the dual-port memory on bus 1727. These data words are provided to the input data alignment and driver block 1720. Some, or all the lines of data bus 1725 and 1727 are selected by the write column address decoder block 1740, and data on those lines is provided on buses 1754 and 1754 to the dual-port memory array 1750.

A configuration RAM 1710 provides configuration bits that control which of the column address bits are passed and which are blocked by the write address conforming logic block 1730. Bits stored in the configuration RAM 1710 also control the alignment of the data provided on the input data buses 1725 and 1727 to the selected memory cell locations in the dual-port array 1750. It is interesting to note that in a specific embodiment, the configuration RAM 1710 does not provide CRAM bits to the column address decoder block 1740. This enables a conventional decoder block to be used by an embodiment of the present invention without modification. This simplifies the design process needed to gain the extra flexibility afforded by a configurable input and output data word.

Figure 18:
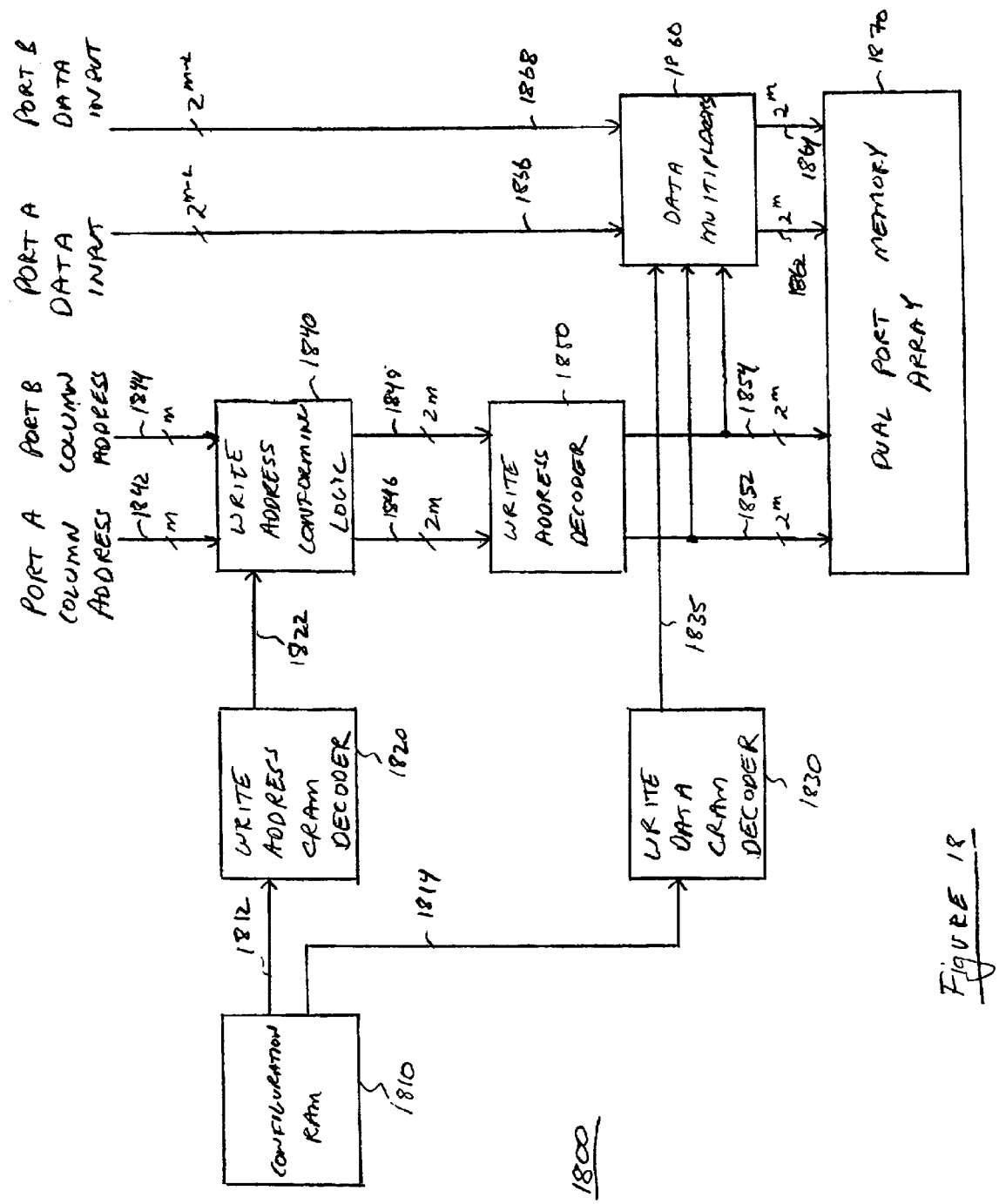
FIG. 18 is a more detailed block diagram of an exemplary address and data input circuitry used for writing data to a dual-port memory consistent with an embodiment present invention.

FIG. 18 is a more detailed block diagram 1800 of the address and data input circuitry used for writing data to a dual-port memory consistent with an embodiment of the present invention. Again, though a dual port is shown, other memories may be used. For example, in a single port memory, or a memory with more than two ports may be used. Included are a configuration RAM 1810, write address CRAM decoder 1820, write data CRAM decoder 1830, address conforming logic 1840, address decoder 1850, data multiplexers 1860, and dual-port memory array 1870.

A column address is provided to Port A on bus 1842, and a Port B column address is provided on bus 1844 to the address conforming logic block 1840. Configuration RAM 810 provides CRAM configuration bits on buses 1812 and 1814 to the write address CRAM decoder 1820 and write data CRAM decoder 1830. Write address CRAM decoder decodes the CRAM bits and provides an output on bus 1822. Under instructions by the bits on bus 1822, the address conforming logic 1840 either passes or blocks bits of the column addresses and provides the results on buses 1846 and 1848 to the address decoder 1850. The address decoder 1850 decodes the conformed addresses and provides a number of column select lines on buses 1852 and 1854 to the dual-port memory array 1870 and data multiplexers 1860.

Port A data is input on bus 1866, and Port B data is input on bus 1868 to the data mix 1860. Data multiplexers 1860, under instructions from the decoded CRAM bits on bus 1835 and column select buses 1852 and 1854, multiplex the input data and provide it to the dual-port memory array 1870 on buses 1862 and 1864.

Figure 19:
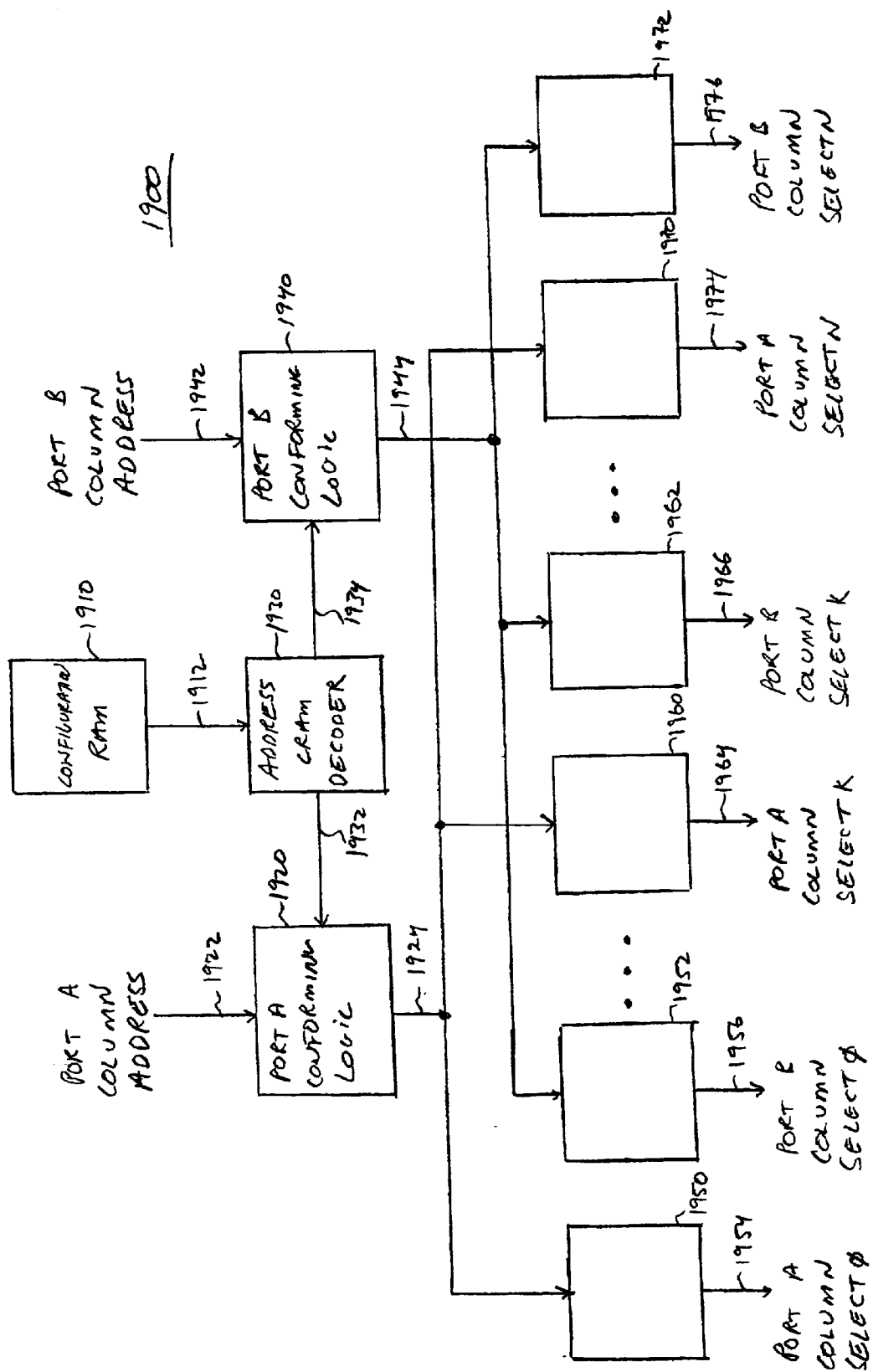
FIG. 19 is a block diagram showing a more detailed a view of an exemplary address path consistent with an embodiment of the present invention.

FIG. 19 is a block diagram 1900 showing a more detailed a view of an address path of an embodiment of the present invention. Included are configuration RAM 1910, Port A conforming logic 1920, address CRAM decoder 1930, and Port B conforming logic 1940. Also included are column select logic blocks 1950, 1952, 1960, 1962, 1970, and 1972.

Configuration RAM 1910 provides address CRAM configuration bits to the address CRAM decoder on bus 1912. Address CRAM decoder 1930 decodes the address CRAM bits and provides decoder information on buses 1932 and 1934 to Port A conforming logic block 1920 and Port B conforming logic block 1940. A column address for Port A is provided on bus 1922 to Port A conforming logic 1920. Again the column address may be a portion of a complete address. For example, a complete address may include a row address portion and a column address portion. The row address portion may be used to select a word line in the memory array, while the column address selects a number of columns in the memory array. Conforming logic block 1920 either passes or blocks bits of the Port A column address and provides the results on bus 1924. Similarly, Port B conforming logic block 1940 either passes or blocks bits of the column address on bus 1942 to bus 1944.

Column select logic blocks 1950 and 1952 receive information on buses 1924 and 1944 and generate Port A and Port B column select lines 1954 and 1956. Column select logic blocks 1960 and 1962 decode address bits from buses 1924 and 1944 and provide column select signals on output lines 1964 and 1966. Column select logic blocks 1970 and 1972 decode address information bits from buses 1924 and 1944 and provide column select signals on lines 1974 and 1976. Three column select logic blocks are explicitly shown for each port, and others are implied. In various embodiments, there may be any number of column select logic blocks and corresponding column select lines.

Figure 20:
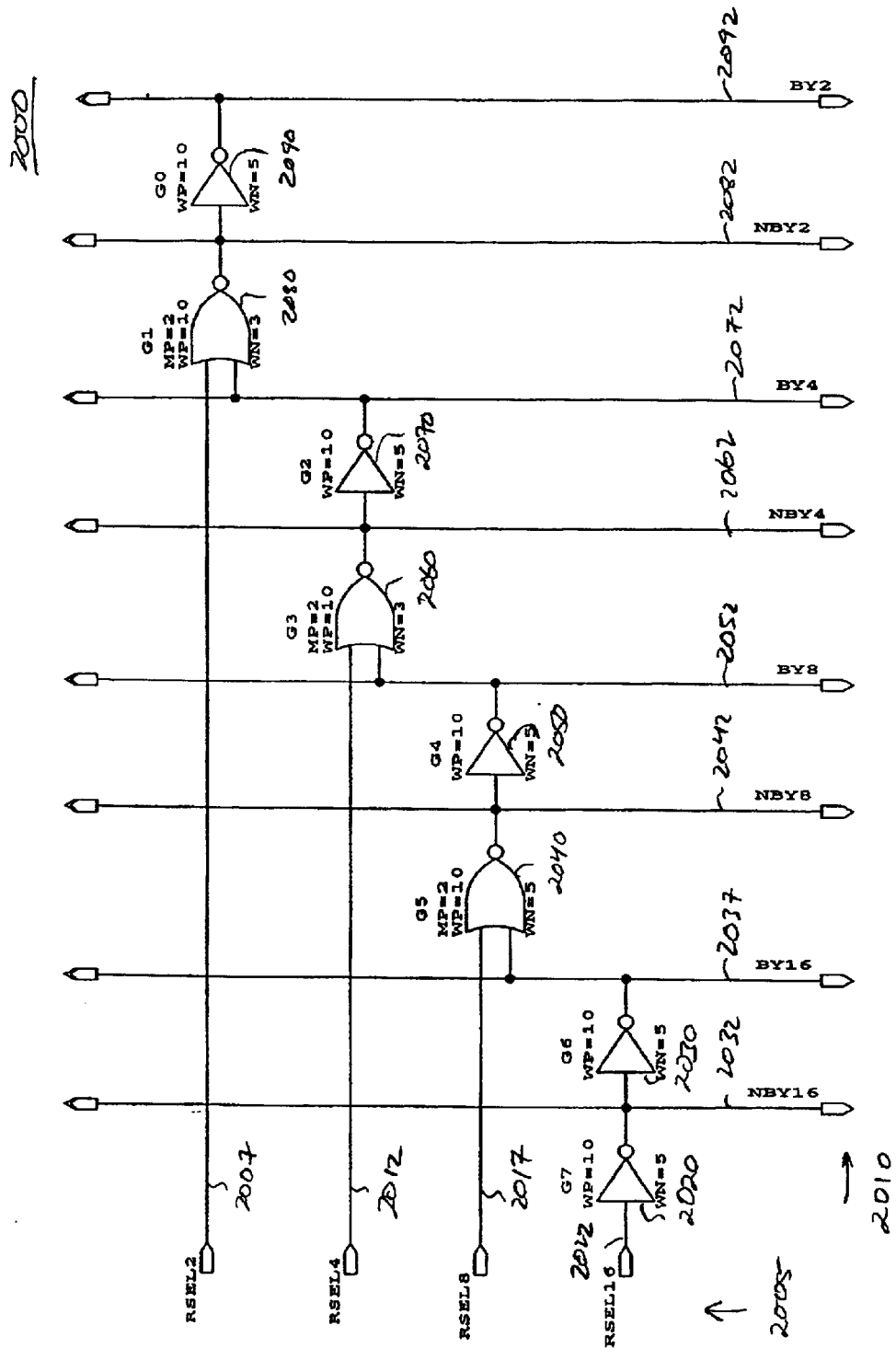
FIG. 20 is a schematic of an exemplary write address CRAM decoder consistent with an embodiment of the present invention.

FIG. 20 is a schematic 2000 of an exemplary write address CRAM decoder, which may be used as of the write address CRAM decoder 1820 in FIG. 18, the address CRAM decoder 1930 in FIG. 19, or other similar circuits in embodiments of the present invention. Included are CRAM input lines 2005, decoder output lines 2010, and logic circuits including inverter 2020, inverter 2030, NOR gate 2040, inverter 2050, NOR gate 2060, inverter 2070, NOR gate 2080, and inverter 2090. As will be seen in later figures, a high on a CRAM decoder output BYx line, such as BY16, results in an address bit being blocked, and a low results that address bit being passed.

In a specific embodiment, either none or one of the CRAM bits on lines 2005 are high. In this specific embodiment, there are 32 columns in the memory array (32 memory cells on a word line), and five column address bits. There are 16 input data lines, so the input data words may be 1, 2, 4, 8, or 16 bits wide. Accordingly, one bit is never blocked, such that one of two banks of 16 bits may be selected. In other embodiments, the size of the input data word may match the length of the word line. In those embodiments, all column select address bits may be blocked. Other bits may be passed when the input word is narrower. For example, if the input word is 4 bits wide, then one of 8 groups of four memory cells needs to be selected. Thus, three address bits are needed, since 2 to the power of 3 is 8. Accordingly, of the five column address bits, two address bits are blocked, and three are passed. To implement this, the RSEL4 signal on line 2012 is set high, causing the output of the NOR gate 2060 to be low, t and the BY4 signal on line 2072 to be high. This in turn causes the output of NOR gate 2080 to be low, and the signal BY2 on line 2092 to be high. Thus, address bits associated with BY2 and BY4 are blocked, and the other three address bits are passed. Specifically, address bits associated with BY8 and BY16, and the previously mentioned bit that is now blocked, are all passive. In this way, a high at an RSEL input "ripples" up the logic chain, blocking other address bits.

In one embodiment, if one bit of the column address is to be blocked, the LSB is blocked. Similarly, if two bits are to be blocked, the two LSBs are blocked, and so on. In the specific embodiment, there are 128 rows, meaning 7 row address bits are needed for the word line decoder, specifically bits A[6:0]. There are 32 columns, selected by five bits A[11:7]. Accordingly, bit A[7] is the LSB of the column address, and is always blocked when any bit of the address is blocked, and the higher ordered bits are blocked when the data word is wider. This ensures that address lines A[11:0] remain dedicated to the memory, despite the configurability of the widths of the data input and output words. In other examples, the number of input lines, output lines, and the logic configuration, may vary.

Figure 21:
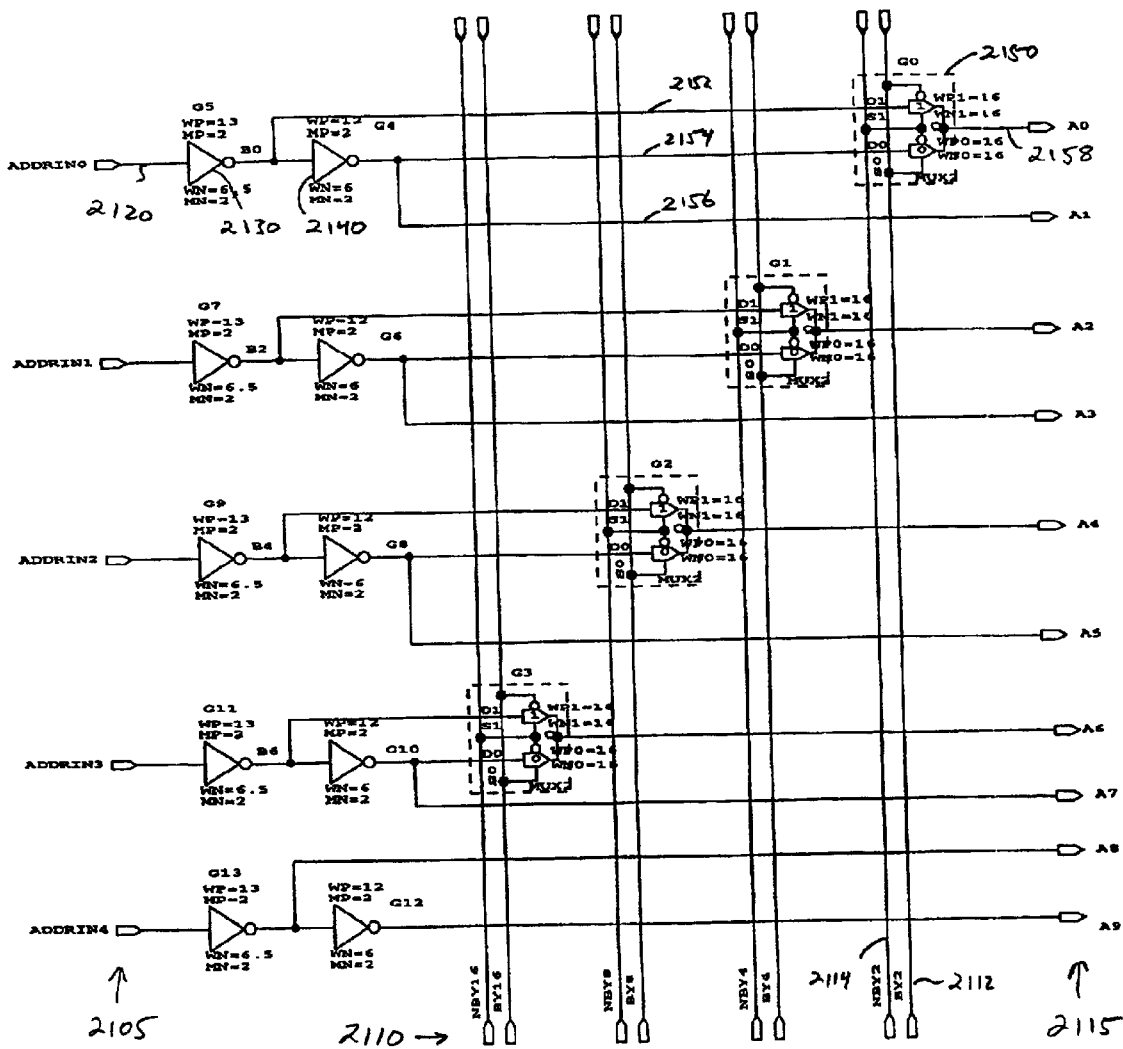
FIG. 21 is a schematic of an exemplary configuration logic block consistent with an embodiment of the present invention.

FIG. 21 is a schematic 2100 of an exemplary configuration logic block which may be used as the write address configuration logic block 1730 in FIG. 17, the address conforming logic block 1840 in FIG. 18, the Port A or Port B conforming logic blocks 1920 and 1940 in FIG. 19, similar circuits in the read paths, or similar circuits in other embodiments of the present invention. Included are address lines 2105, decoded CRAM bit lines 2110, and output address lines 2115. Each input address line is associated with two inverters, a multiplexer, two decoded CRAM bit lines, and two output address lines.

Specifically, a first address signal is applied on line 2120 to inverter 2130. Inverter 2130 inverts the signal and provides an output to multiplexer 2150 and inverter 2140. Inverter 2140 provides an output address signal A1 on line 2156, which connects to the multiplexer 2150. Multiplexer 2150 passes either the output of the first inverter 2130, or the output of the second inverter 2140, as the output A0 on line 2158. If the BY2 signal on line 212 is low, the output of the first inverter 2130 is passed to the output. In that case, A0 and A1 signals on lines 2158 and 2156 form a complementary pair. For example, when the signal ADDRIN0 on line 2120 is high, the output address bit A1 on line 2156 is high, and the output address bit A0 on line 2158 is low.

When the BY2 signal on line 2112 is high, the address bit is blocked. Specifically when the BY2 signal on line 2112 is high, the output of the second inverter 2140 is passed as the output A0 on line 2158. In this case, the signal A0 and A1 on lines 2158 and 2156 are equal in value, and do not form a complementary pair. For example, if the ADDRIN0 signal on line 2120 is low, both the A0 and A1 signals on lines 2158 and 2156 are low. This enables a conventional decoder to be used in embodiments of the present invention without further modification. In other examples, the number of input lines and output lines, and the logic configuration, may vary.

FIG. 22 shows simplified schematics of conforming logic and decoders, along with associated truth tables and equations for embodiments of the present invention. Schematic 2200 has two input address lines 2202 and 2204, which drive the inputs of inverters 2206 and 2208. The outputs of these inverters, as well as the input address lines, drive the inputs of AND gates 2203, 2205, 2207, and 2209. The inverters 2206 and 2208 correspond to input inverters, such as inverter 2140 in FIG. 21. The AND gates correspond to structures in the column decoder, such as the write column address decoder 1740 in FIG. 17, the address decoder 1850 in FIG. 18, and the column decoder blocks 1950, 1952, 1960, 1962, 1970, and 1972 in FIG. 19. The outputs of these AND gates provide column decoder lines C0 through C3. As can be seen from the truth table 2210, for each combination of polarities for input address signals A1 and A0, one column is selected. This enables two address lines to be used to select either one of four columns, or one of four groups of columns. This truth table may be expressed as equations 2220.

Schematic 2230 is schematic 2200 redrawn to show what happens when address line A0 is blocked. Specifically, a multiplexer, such as 2150 in FIG. 21, is toggled so that the inverse of input address line A0 is applied to the decoder. That is, the inverter 2235 is inserted to simulate a change of input selection in multiplexer 2150. The equations for circuit 2230 are listed as 2240. Truth table 2250 is derived from the equations 2240. As can be seen by comparison of the first and third row of entries 2252 and 2256, two different column lines are selected for each polarity of A1. As can be seen by examining the second and fourth row of entries 2254 and 2258, A0—the blocked address,—is held low for proper operation. By adding the capability of inserting or removing the inverter 2235, the decoder may be used to select either one of four columns, or two of four columns, without changing the decoding NAND gates themselves.

In these simplified examples, there are two input address lines and four column select lines. Other embodiments may have a different number of input address lines and column select lines. For example, in one embodiment there are five input address lines, and 32 column select lines. Other numbers of input address lines and column select lines may be used. There may be six input address lines, or seven input addresses, with 64 or 128 column select lines. In other example, the number of lines, memory cells, and possible widths may vary.

Figure 23:
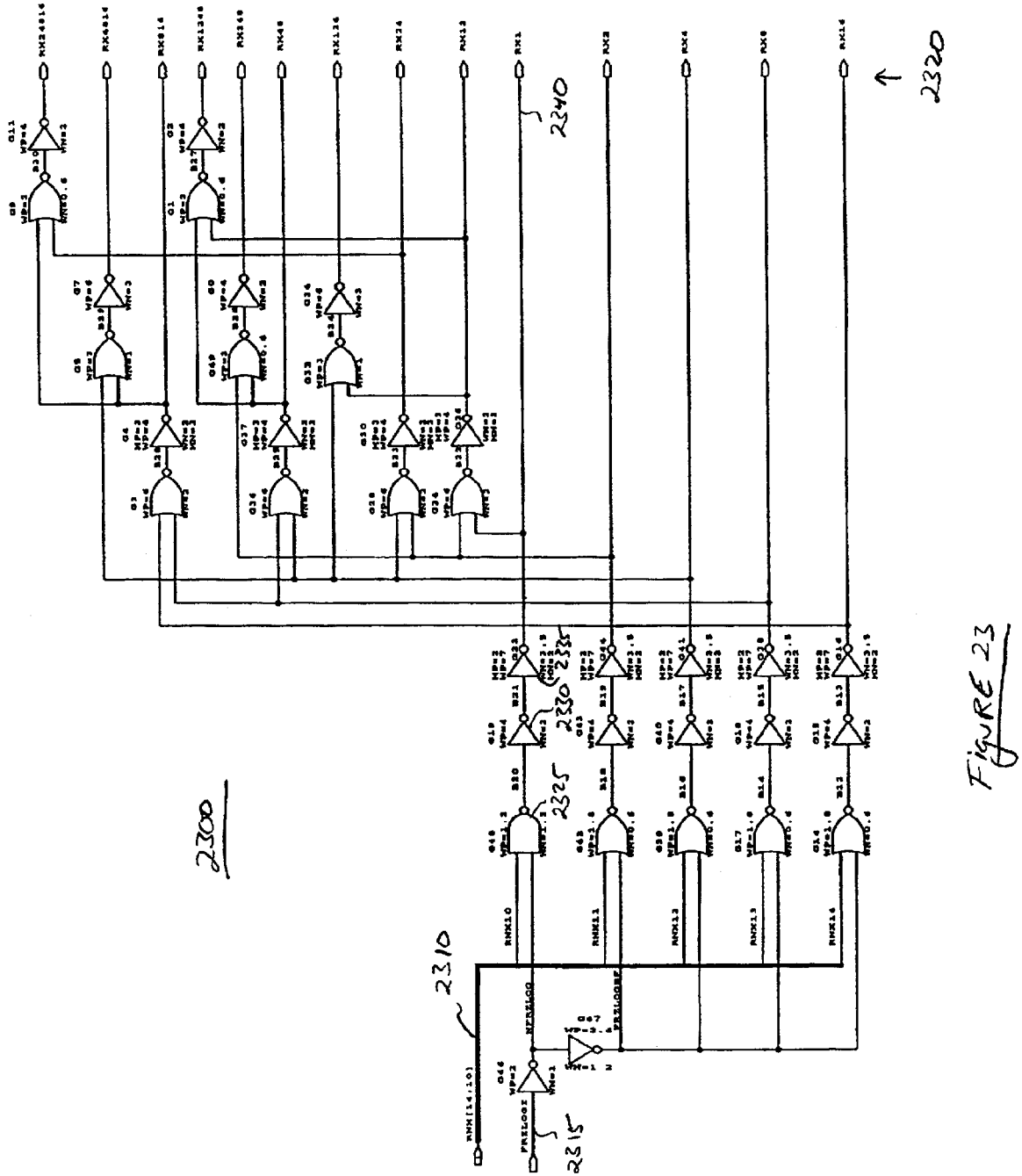
FIG. 23 is a schematic of an exemplary data CRAM decoder consistent with an embodiment of the present invention.

FIG. 23 is an exemplary schematic 2300 of a data CRAM decoder, which may be used as the write data CRAM decoder 1830 in FIG. 18, or in other embodiments of the present invention. Included are CRAM input lines 2310, and CRAM decoder output lines 2320. An input logic signal on line 2315 provides a default state. The data CRAM decoder output lines control a plurality of data multiplexers, which in turn control the shifting of data bits on data input lines to memory cells on a selected word line in a memory array. In other embodiments, the number of inputs, outputs, and the logic configuration may vary.

Figure 24:
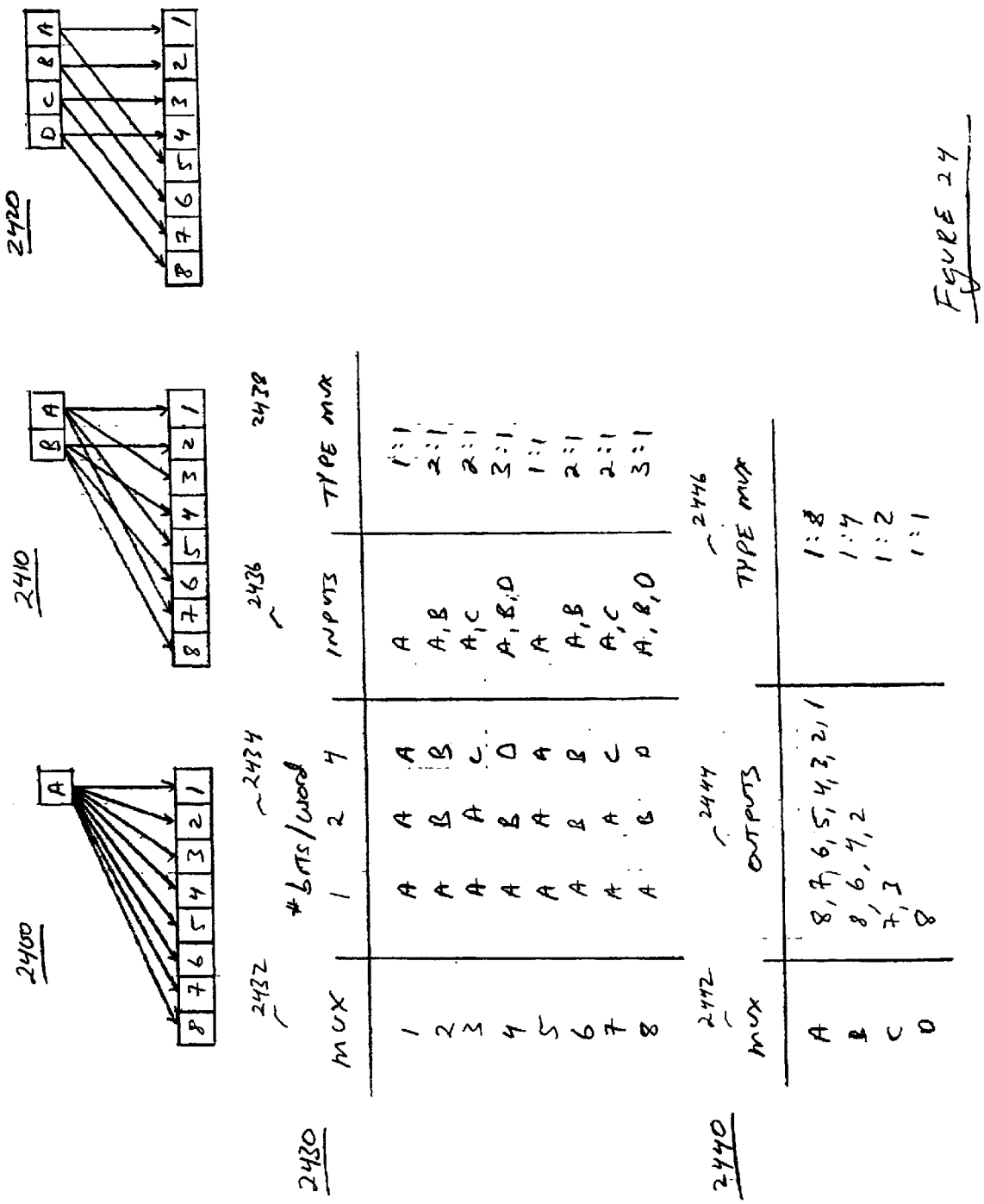
FIG. 24 illustrates the functioning of an exemplary data multiplexing and alignment circuit consistent with an embodiment of the present invention.

FIG. 24 illustrates the functioning of a data multiplexing and alignment circuit, such as the input data alignment and driver block 1720 in FIG. 17, data multiplexers 1860 in FIG. 18, and other similar blocks in embodiments of the present invention. In this example, a four input wide data bus, with wires labeled A–D, provides data for eight memory cells on a word line. The memory cells are labeled 1–8. In an embodiment of the present invention, there are a number of rows of memory cells, each memory cell in a column. In this example, each of the eight shown memory cells correspond to a column of memory cells. There may be any number of memory cells in a word line. For example, in a specific embodiment, there are 32 memory cells in each word line.

In diagram 2400, the input data word is one bit wide. Accordingly, line A provides data for each of the eight memory cells on the word line. That is, during a write operation, data from line A may be written to cell 1. During a different write cycle, data from line A may be written to one of cells 2 through 8. In example 2410, the input word is two bits wide. Thus, data from lines A and B may be written to cells 1 and 2. During a different write cycle, data from lines A and B may be written to cells 3 and 4, 5 and 6, 7 and 8, or 1 and 2 again. In 2420, the data input word is 4-bits wide, so all four input lines A through D are used. During a write cycle data from lines A through D may be written to cells 1 through 4. During a different write cycle, data on lines A through D may be written to cells 5 through 8 or 1 through 4 again.

To provide this flexibility, an embodiment of the present invention uses a number of multiplexers. Each multiplexer resides between data inputs and a memory cell array. Thus, in this example, eight multiplexers are needed, one multiplexer in front of each of the eight columns of memory cells. Table 2430 summarizes the data input from which each memory cells receives its input in each of the above three modes. Specifically, the multiplexer in front of the memory cells in memory column I receives its data input from line A whether the input data word is 1-bit, 2-bits, or 4-bits wide. Accordingly, the input multiplexer is a 1:1 type multiplexer. In a practical sense, this means that memory cell column 1 may be coupled to data input A. Memory cell 2 receives data from line A when the input word is one bit wide, and receives data from line B when the input word is either 2-bits or 4-bits wide. Accordingly, as shown in column 2436, the multiplexer in front of memory cell column 2 is multiplexed between data on lines A and B. Thus, as is shown in column 2438, a 2:1 multiplexer is needed.

Alternately, instead of a fan-in type multiplexer in front of the memory columns, a fan-out type multiplexer may be placed after the data lines. This is summarized in table 2440. Accordingly, as is shown in column 2444, line A needs to be able to fan out to each of the eight memory cells columns. Thus, as is shown in column 2446, a 1:8 multiplexer is needed. Line B needs to be available to memory cells 2, 4, 6, and 8. As is shown in column 2444. A 1:4 multiplexer is needed for this, as is shown in column 2446.

Using fan-in type multiplexers has the disadvantage of requiring more multiplexers, however the eight multiplexers require fewer inputs, and the multiplexers are similar to each other. Also, as can be seen in table 2430, columns, one and five, do not need a multiplexer at all. Using fan-out type multiplexers has the advantage of requiring fewer multiplexers, but requires large 1:8 and 1:4 multiplexers. In other embodiments, the number of data lines, the number of memory cells in a row, and accordingly the number and type of multiplexers may vary. In other embodiments, the number of lines, memory cells, as well as the number of multiplexers may vary.

In this example, an address may select one data input and one column in memory. In other embodiments, an address may at a minimum select two data inputs and two columns in memory. Alternately, an address may at a minimum select more than two data inputs and two columns in memory.

Figure 25:
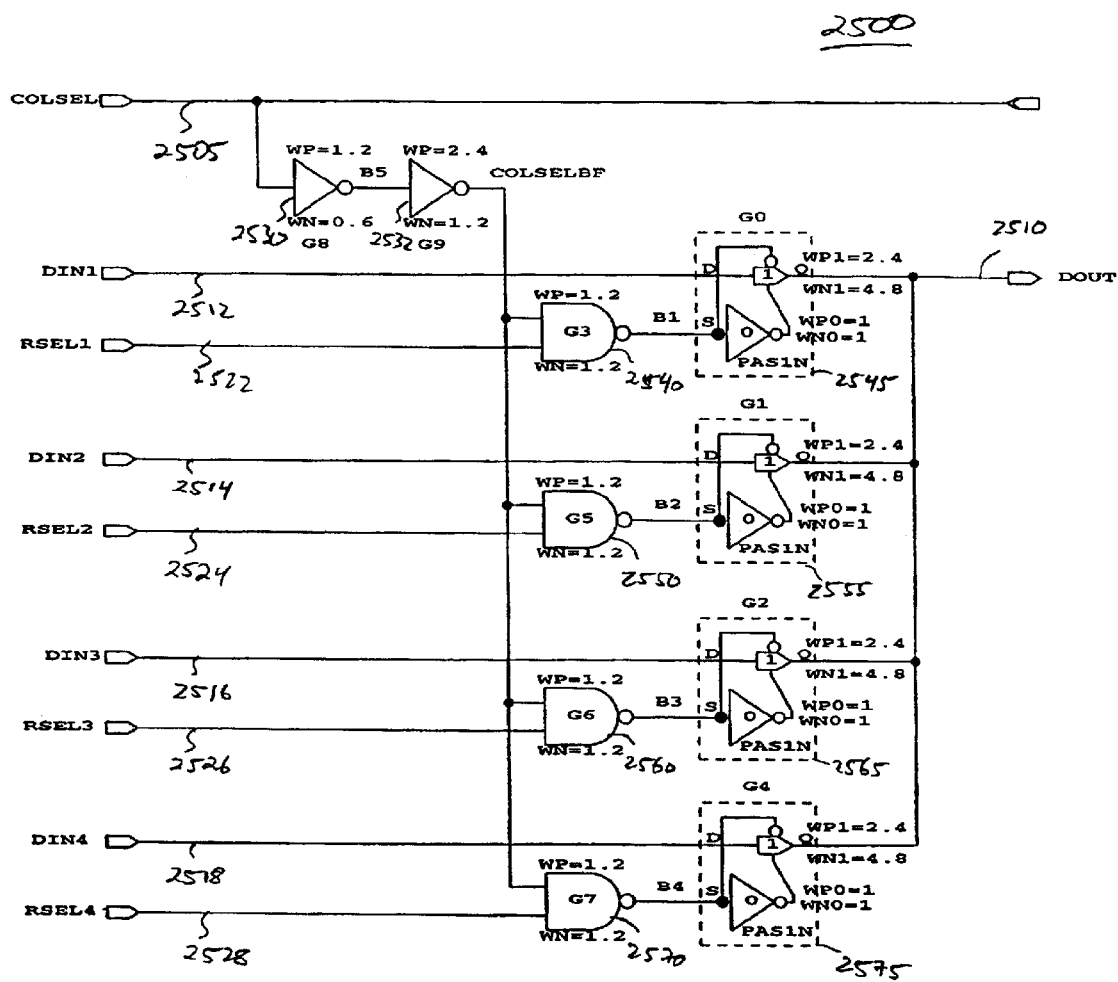
FIG. 25 is an example of a 4:1 multiplexer that may be used in the circuitry of FIG. 24.

FIG. 25 is an example of a 4:1 multiplexer 2500 that maybe used in accordance with embodiments of the present invention. This is an example of a fan-in multiplexer. Included are column select line 2505, decoded CRAM bit inputs 2522, 2524, 2526, and 2528, data inputs 2512, 2514, 2516, and 2816, and data output line 2510. Inverters 2530 and 2532 buffer the column select input signal. NAND gates 2540, 2550, 2560, and 2570, and pass gates 2545, 2555, 2565, and 2575, form the multiplexer. An individual pass gate is on if the multiplexer is enabled by the column select signal on line 2505, and the corresponding decoded CRAM bit is high. For example, if the column select signal on line 2505 is high, and RSEL1 on line 2522 is high, the output of NAND gate 2540, B1, is low. The pass gate 2545 is open and the signal DIN1 on line 2512 is passed as the output signal DOUT on line 2510. If the particular column is not selected, that is the column select signal on line 2505 is low, then data is not written to a memory cell in the column. Accordingly, the multiplexer does not pass a signal on the output line 2510.

Figure 26:
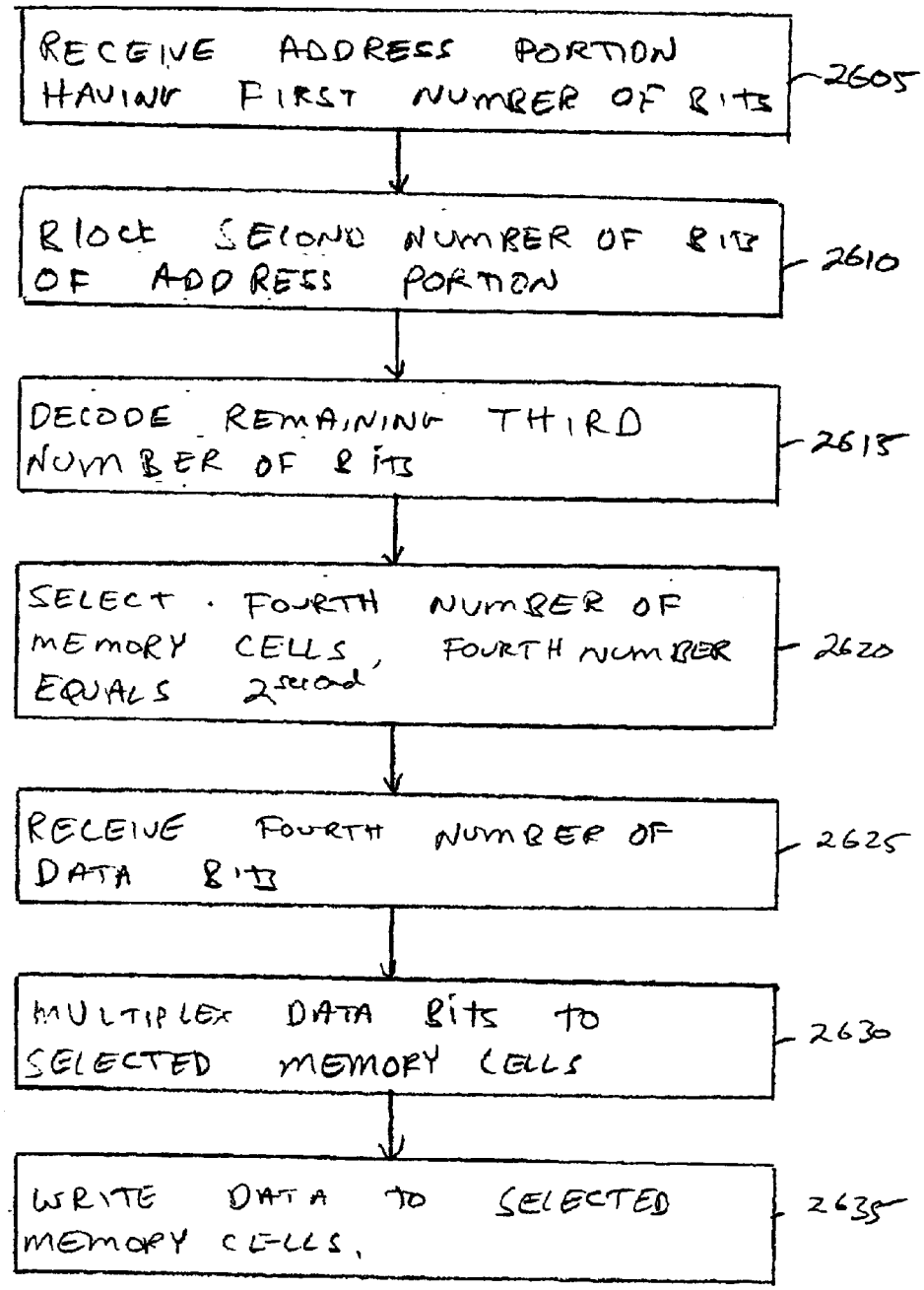
FIG. 26 is a flowchart of a method of writing data to a memory consistent with an embodiment of the present invention.

FIG. 26 is a flowchart 2600 of a method of writing data to a memory consistent with an embodiment of the present invention. In act 2605, an address portion is received. This address portion is made up of a first number of bits. For example, a complete address may have 12 bits, where the column address portion comprises the five MSBs, and a row address portion is made up of the seven LSBs. A second number of bits of this address portion is blocked in act 2610. The second number may be zero, it may be equal to the first number, or it may be any integral number in between. The remaining unblocked bits are decoded in act 2615, and in act 2620 a fourth number of memory cells are selected. In an embodiment of the present invention, these memory cells are selected by a fourth number of column select lines. The fourth number is equal to 2 to the power of the second number. In act 2625, a fourth number of data bits is received at a data input. The data is multiplexed to the selected memory cells in act 2630, and in act 2635, data is written to the selected memory cells.

Figure 27:
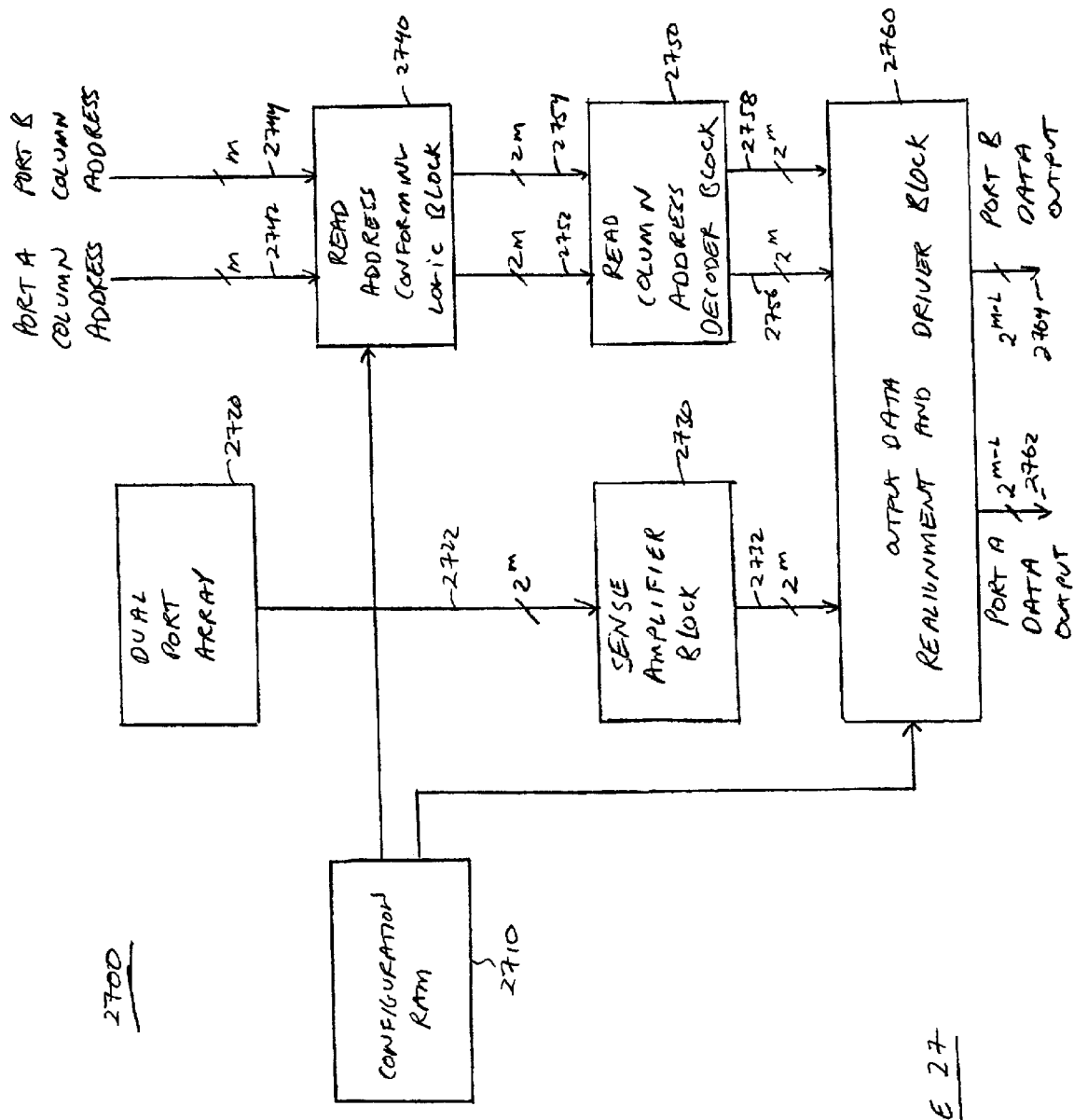
FIG. 27 is a block diagram of an exemplary read address and data output path for a dual-memory consistent with an embodiment of the present invention.

FIG. 27 is an exemplary block diagram 2700 of a read address and data output path for a dual-port memory consistent with an embodiment of the present invention. Included are a configuration RAM 2710, dual-port memory array 2720, sense amplifier block 2730, read address conforming logic block 2740, read column address decoder block 2750, and output data realignment and driver block 2760.

A column address for Port A is received on bus 2742, and a Port B column address is received on bus 2744 by read address conforming logic block 2740. Individual bits of the read addresses are blocked or passed on buses 2752 and 2754 to the read column address decoder block 2750. The conformed address for each port is decoded and provided to the output data realignment and driver block 2760 on buses 2756 and 2758. The memory array 2720 provides read data signals on read lines 2722 to the sense amplifier block 2730, which senses the states of the memory cells in the dual-port array 2720, and amplifies the signal, thus providing outputs on bus 2732 to the output data realignment driver block 2760. A configuration RAM 2710 provides bits which instruct the read address conforming logic blocked 2740 as to which address bits to either block or pass. Configuration RAM 2710 also provides bits which instruct the data realignment and driver block how to align data from the memory court to the data output lines on buses 2760 to and 2764. In a specific embodiment, the read column address decoder block does not receive information from the configuration ran 2710. This allows a conventional read column address decoder to be used. The read address conforming logic block 2740 allows an addressing scheme consistent with a configurable output data width. The output data realignment and driver block 2760 aligns data coming from different positions along a word line in the dual-port array 2720 to selected output data lines on buses 2762 and 2764.

Figure 28:
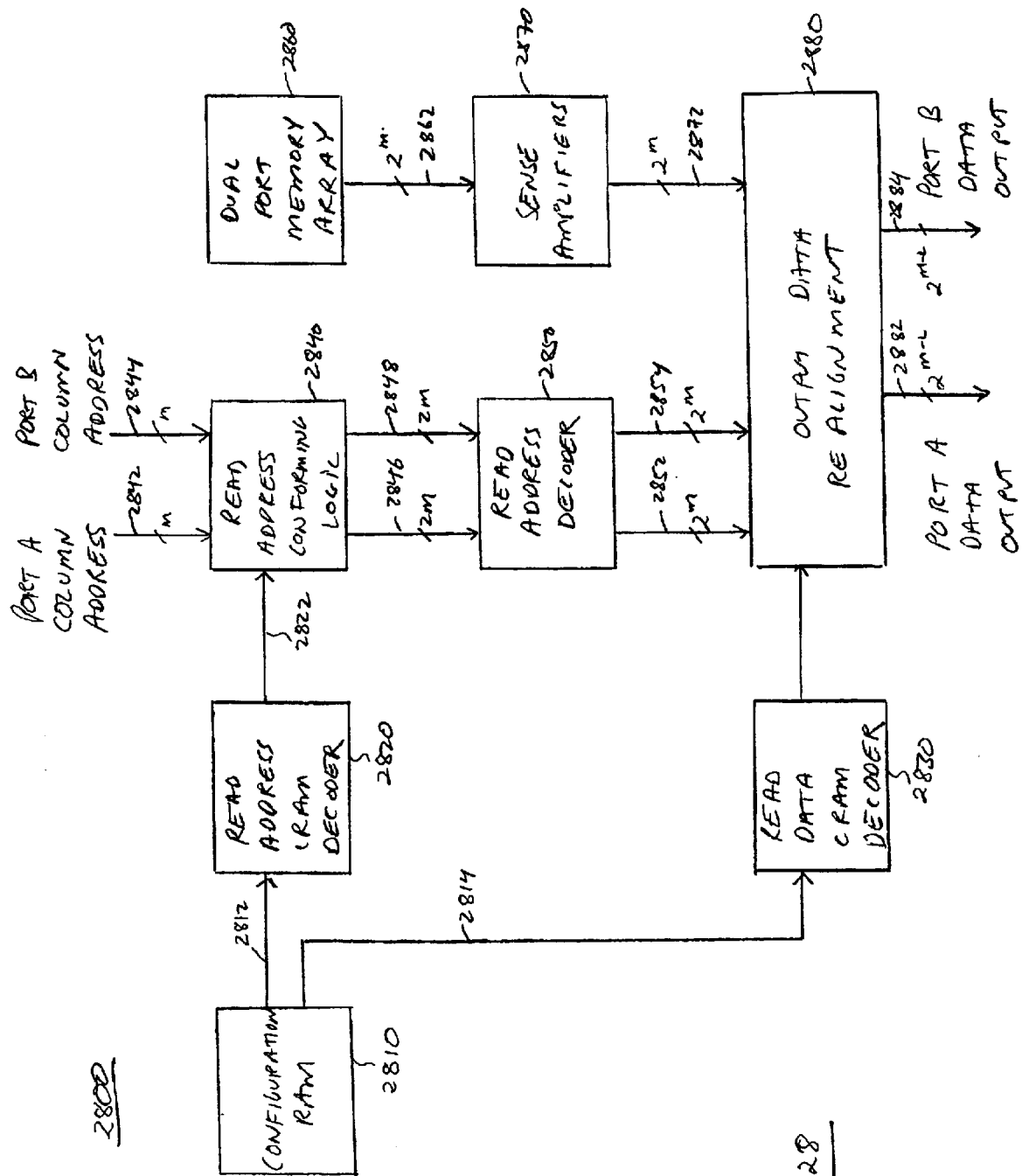
FIG. 28 is a more detailed block diagram of the address and data paths for a read portion of a dual-port memory.

FIG. 28 is a more detailed block diagram 2800 of the address and data paths for a read portion of a dual-port memory consistent with an embodiment of the present invention. Included are configuration RAM 2810, read address CRAM decoder 2820, read data CRAM decoder 2830, read conforming logic 2840, read address decoder 2850, dual-port memory array 2860, sense amplifiers 2870, and output data realignment block 2880.

Configuration RAM 2810 provides configuration CRAM bits which are decoded by read address cram decoder 2820, which in turn provides decoded CRAM output bits on bus 2822 to read conforming logic block 2840. These decoded CRAM bits instruct the read conforming logic block 2840 to block or pass address bits of the Port A column address on bus 2842 and the Port B column address on bus 2844. These conformed addresses are provided on buses 2846 and 2848 to the read address decoder 2850. The read address decoder decodes the addresses and provides outputs on buses 2852 and 2854 to the output data realignment block 2880. Sense amplifiers 2870 read data from the dual-port memory array 2860 and provide outputs on bus 2872 to the data realignment block 2880.

Configuration RAM 2810 provides configuration CRAM bits to the read data CRAM decoder 2830, which provides decoded CRAM bits to the data realignment block 2880. These decoded bits instruct the data realignment block 2880 to steer data from the sense amplifiers 2870 to selected output data lines. Output data realignment block 2880 provides outputs on bus 2882 to a Port A data output and on bus 2884 to a Port B data output.

Figure 29:
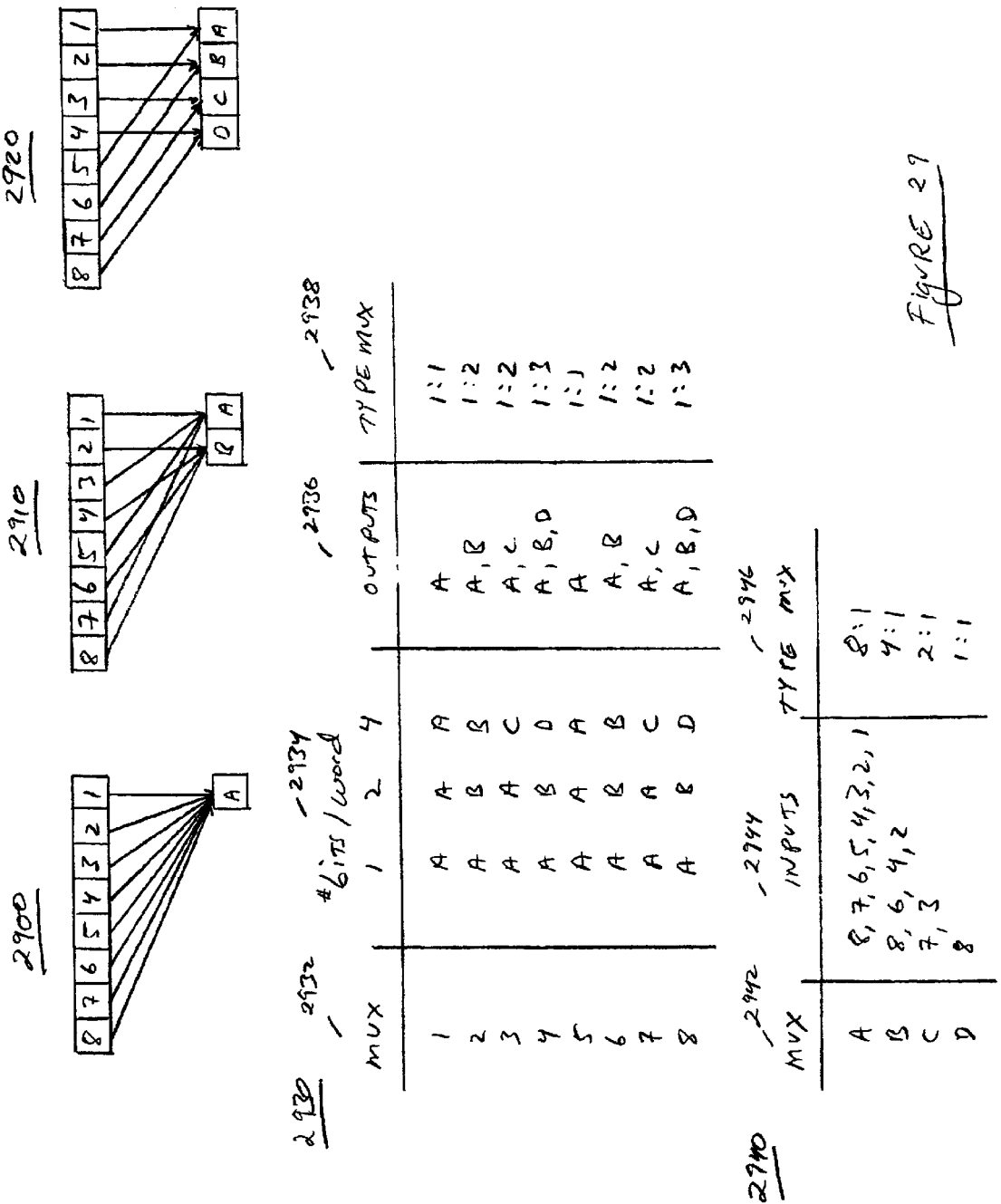
FIG. 29 illustrates the operation of an exemplary data realignment circuit consistent with an embodiment of the present invention.

FIG. 29 illustrates the operation of a data realignment circuit such as the output data realignment and driver block 2760 in FIG. 27, the output data realignment block 2880 in FIG. 28, or similar circuits in embodiments of the present invention. In this example, data stored in a word line comprising eight memory cells selectable by eight column selected lines is output to a data bus which is 4-bits wide. In diagram 2900, the output data word is one bit wide. Accordingly, in one read cycle, data from memory cell 1 may be read to output line A. During other read cycles, data from one of memory cells 2–8 may be read at line A or data from memory cell 1 may be read again. In diagram 2910, the output data word is 2-bits wide. Thus, during one read cycle, data from memory cells 1 and 2 may be read at data output lines A and B. During another read cycle, data from memory cells 3 and 4, 5 and 6, or 7 and 8, may be read at data output lines A and B or data from memory cells 1 and 2 may be read again. In diagram 2920, the output data word is 4-bits wide. Data from memory cells 1–4 may be read at lines A–D during a read cycle. During another read cycle, data from cells 5–8 may be read at output lines A–D, or data from memory cells 1–4 may be read again.

Table 2930 shows the multiplexing functions needed to implement the above diagrams. In this example, 8 fan-out type multiplexers are used, and are placed after each of the memory cell columns 1–8. In a specific embodiment of the present invention, these multiplexers are placed after a sense amplifier block. In column 2932, eight multiplexers are listed. The multiplexer after the first column only sends data to output line A. Thus, a multiplexer is not required, and the first column may be coupled to output line A. For the second column (row 2 in the table), if the output word is one bit wide, the multiplexer passes data to line A. But if the output word is 2-bits or 4-bits wide, data is passed to output line B. Accordingly, the second multiplexer must be able to pass data from the second memory cell column to either output lines A or B, as indicated in column 2936. Thus, a 1:2 fan-out multiplexer is required, as is shown in column 2938.

Instead of using a fan-out multiplexer after the sense amplifiers, a fan-in multiplexer may be placed in front of each of the data lines. This is shown in table 2940. In this case, four multiplexers are used, one in front of each data line. Data line A must be able to select from any of the eight column addresses, as indicated in table 2940 column 2944. Thus, this multiplexer is an 8:1 fan-in type, as indicated in column 2946. This scheme has the advantage of requiring fewer multiplexers, but the multiplexers, particularly the multiplexer front of line A, is wider than the multiplexers required by a fan-out scheme consistent with table 2930. In this example, both an 8:1 and a 4:1 multiplexer are needed. In other embodiments, as with all the included figures, the number of memory cells, lines, and other implementation details may vary.

In this example, an address may select one data output and one column in memory. In other embodiments, an address may at a minimum select two data outputs and two columns in memory. Alternately, an address may at a minimum select more than two data outputs and two columns in memory.

Figure 30:
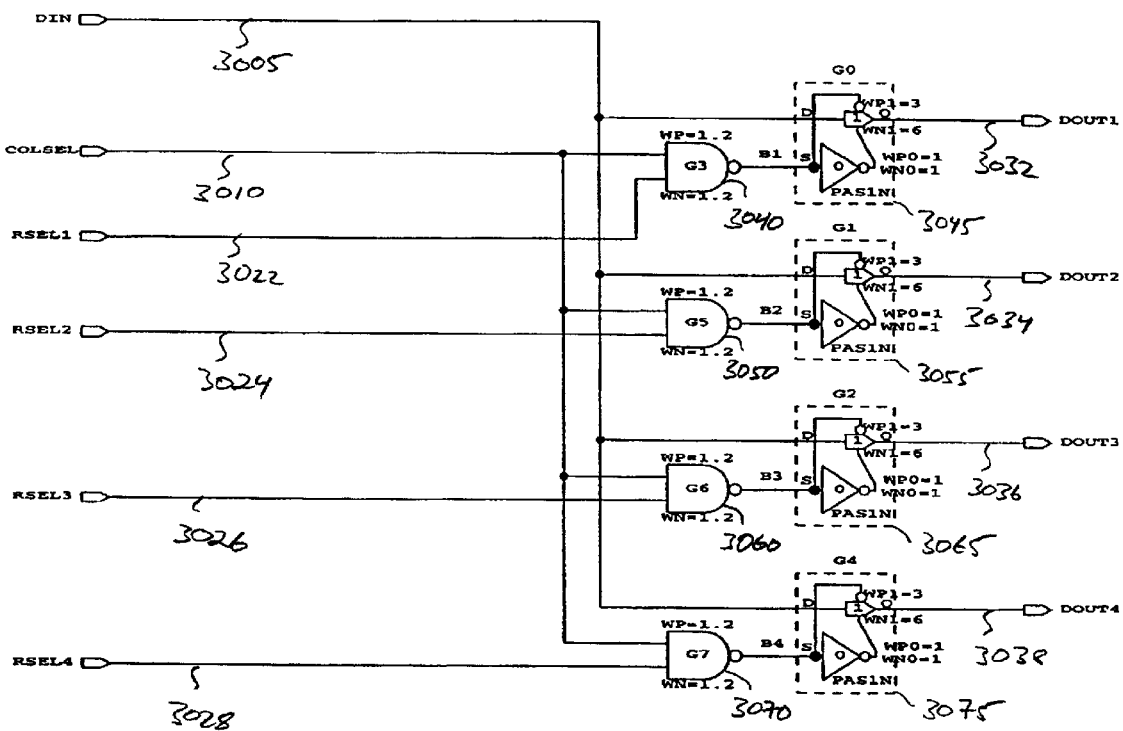
FIG. 30 is a schematic showing an exemplary fan out multiplexer for use in the realignment circuit of FIG. 29.

FIG. 30 is a schematic 3000 showing a fan-out multiplexer for use in a realignment circuit consistent with an embodiment of the present invention. Included are data input line 3005, column select line 3010, decoded CRAM bit input lines 3022, 3024, 326, and 3028, and data outputs lines 3032, 3034, 3036, and 3038. NAND gates 3040, 3050, 3660, and 3070, and pass gates 3045, 3055, 3665, and 3075, form the multiplexer core.

When data is being read from a column, the column select line 3010 is high. Accordingly, when a decoded CRAM bit is high, the associated data output passes the data signal on line 3005. For example, when the column select signal on line 3010 is high and the decoded CRAM bit RSEL1 on line 3022 is high, NAND gate 3040 output B1 is low, and pass gate 3045 is open. Accordingly, data on line 3005 is passed to the DOUT1 output line 3022. In this way, data from a memory cell column associated with line 3005 may be passed to one of four output lines.

Figure 31:
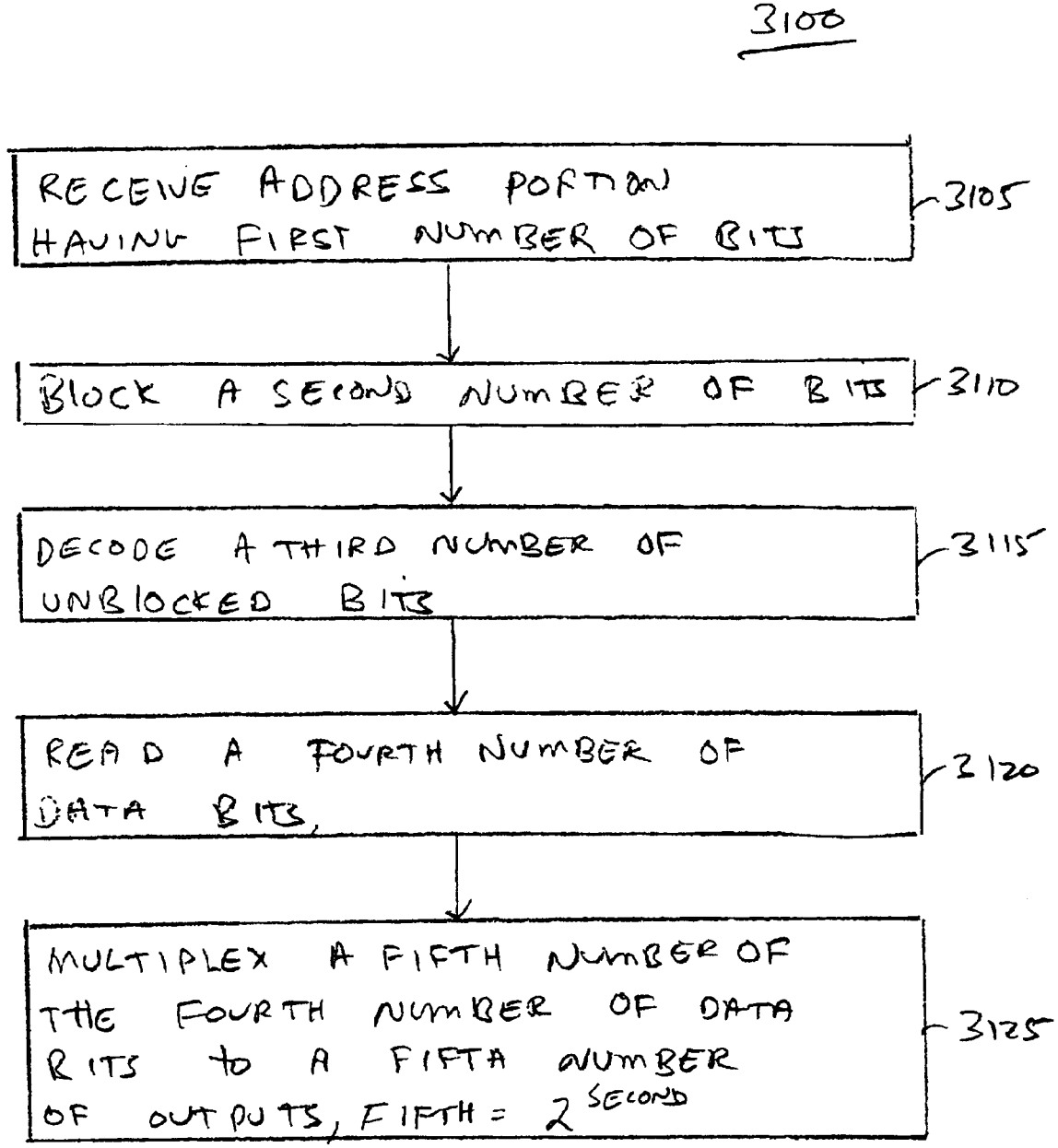
FIG. 31 is a flowchart for a method of reading data from a memory consistent with an embodiment of the present invention.

FIG. 31 is a flowchart 3100 for a method of reading data from a memory consistent with an embodiment of the present invention. In act 3105, an address portion is received. The address portion is made up of a first number of bits. In one example, this address portion comprises the MSBs of a complete address, where the LSBs are used in selecting a word line in the memory array. In act 3110, a second number of bits of the address portion are blocked. The second number may be equal to the first number, it may be zero, or any number in between. In act 3115, the remaining bits are decoded. In act 3120, a fourth number of data bits are read. These bits are multiplexed to a fifth number of outputs in act 3125. The fifth number is a equal to 2 to power the second number.

This description of the invention has been presented for the purposes of illustration and description. It is not intended to be exhaustive or to limit the invention to the precise form described, and many modifications and variations are possible in light of the teaching above. For example, though a dual port memory is shown in the exemplary figures, the present invention may be used with a single port or other multiport memories. The embodiments were chosen and described in order to best explain the principles of the invention and its practical applications. This description will enable others skilled in the art to best utilize and practice the invention in various embodiments and with various modifications as are suited to a particular use. This invention is defined by the following claims.

What is claimed is:

1. A method of writing to a memory comprising:

receiving an address portion comprising a first number of bits;

blocking a second number of bits of the address portion, the second number less than the first number;

passing a third number of bits of the address portion, wherein the second number summed with the third number is equal to the first number;

decoding the third number of bits to select a fourth number of memory cells, the fourth number equal to two to the power of the second number;

receiving a fourth number of data bits; and writing the fourth number of data bits to the fourth number of memory cells.

2. The method of claim 1 further comprising:

after receiving a fourth number of data bits, multiplexing the fourth number of data bits to the selected fourth number of memory cells.

3. The method of claim 2 wherein the memory is a dual port memory.

4. A method of reading from a memory comprising:

receiving an address portion comprising a first number of bits;

blocking a second number of bits of the address portion, the second number less than the first number;

passing a third number of bits of the address portion, wherein the third number summed with the second number is equal to the first number;

reading a fourth number of data bits from a fourth number of memory cells; and decoding the third number of bits to multiplex a fifth number of data bits to a fifth number of outputs.

5. The method of claim 4 wherein the fifth number is equal to two to the power of the second number.

6. The method of claim 5 wherein the memory is a dual port memory.

7. An integrated circuit comprising:
an address conforming logic block configured to receive a first number of address bits, block a second number of address bits, and pass a third number of address bits;
an address decoder coupled to the address conforming logic block configured to decode the third number of address bits and provide a fourth number of column select signals; and
a memory array having memory cells arranged in rows and columns, configured to receive the fourth number of column select signals.

8. The integrated circuit of claim 7 wherein the second number summed with the third number is equal to the first number.

9. The integrated circuit of claim 8 wherein the fourth number is equal to two to the power of the second number.

10. The integrated circuit of claim 8 wherein the fourth number is equal to a fifth number multiplied by two to the power of the second number.

11. The integrated circuit of claim 7 further comprising:
a multiplexer circuit configured to receive a fourth number of data bits and the fourth number of column select signals,
wherein the fourth number of column select signals selects a fourth number of columns in the memory array, and the multiplexer circuit multiplexes the fourth number of data bits to the fourth number of columns in the memory array.

12. The integrated circuit of claim 11 further comprising:
a configuration memory having a plurality of storage cells for storing a plurality of configuration bits,
wherein the plurality of configuration bits is used to determine the second number and the third number.

13. The integrated circuit of claim 11 wherein the integrated circuit is a programmable logic device.

14. An integrated circuit comprising:
an address conforming logic block configured to receive a first number of address bits, block a second number of address bits, and pass a third number of address bits;
an address decoder coupled to the address conforming logic block configured to decode the third number of address bits and provide a fourth number of column select signals;
a memory array having memory cells arranged in rows and a fifth number of columns; and
a fifth number of sense amplifiers coupled to the memory array, configured to provide a fifth number of read data bits.

15. The integrated circuit of claim 14 further comprising:
a multiplexing circuit coupled to the address decoder and the fifth number of sense amplifiers, configured to receive the fourth number of column select signals and the fifth number of read data bits, and multiplex a fourth number of read data bits to a fourth number of outputs.

16. The integrated circuit of claim 15 wherein each of the fifth number of sense amplifiers is coupled to one of the fifth number of columns in the memory array.

17. The integrated circuit of claim 16 further comprising:
a plurality of storage cells configured to store a plurality of configuration bits,
wherein the plurality of configuration bits is used to determine the second number and the third number.

18. The integrated circuit of claim 15 wherein the second number summed with the third number is equal to the first number.

19. The integrated circuit of claim 15 wherein the fourth number is equal to two to the power of the second number.

20. The integrated circuit of claim 15 wherein the fourth number is equal to a fifth number multiplied by two to the power of the second number.

21. The integrated circuit of claim 17 wherein the integrated circuit is a programmable logic device.

22. An integrated circuit comprising:
a memory array having a plurality of memory cells arranged in rows and columns;
address configuration means for receiving a plurality of address bits comprising a first portion of address bits and a second portion of address bits, blocking the first portion of address bits, and providing the second portion of address bits;
address decoder means for receiving the second portion of address bits and providing a plurality of select lines, wherein the plurality of select lines selects a plurality of columns of memory cells in the memory array; and
data multiplexer means for receiving a plurality of data bits and the plurality of select lines, and multiplexing the plurality of data bits to the plurality of columns of memory cells in the memory array.

23. The integrated circuit of claim 22 wherein the first portion of address bits comprises a first number of address bits, the second portion of address bits comprises a second number of address bits, and the plurality of selected columns of memory cells in the memory array comprises a third number of selected columns of memory cells in the memory array, and
wherein the third number is equal to a fourth number multiplied by two to the power of the first number.

24. The integrated circuit of claim 22 wherein the first portion of address bits comprises a first number of address bits, the second portion of address bits comprises a second number of address bits, and the plurality of selected columns of memory cells in the memory array comprises a third number of selected columns of memory cells in the memory array, and
wherein the third number is equal to two to the power of the first number.

25. An integrated circuit comprising:
a memory array having a plurality of memory cells arranged in rows and columns;
sense amplifier means for reading data from the columns of memory cells in the memory array and providing a plurality of read data bits;
address configuration means for receiving a plurality of address bits comprising a first portion of address bits and a second portion of address bits, blocking the first portion of address bits, and providing the second portion of address bits;
address decoder means for receiving the second portion of address bits and providing a plurality of select lines; and
data multiplexer means for receiving the plurality of read data bits and the plurality of select lines, and multiplexing a first portion of the plurality of read data bits to a plurality of output data lines.

26. The integrated circuit of claim 25 wherein the first portion of address bits comprises a first number of address bits, the second portion of address bits comprises a second number of address bits, and the first portion of the plurality of read data bits comprises a third number of read data bits, and wherein the third number is equal to a fourth number multiplied by two to the power of the first number.

27. The integrated circuit of claim 25 wherein the first portion of address bits comprises a first number of address bits, the second portion of address bits comprises a second number of address bits, and the first portion of the plurality of read data bits comprises a third number of read data bits, and wherein the third number is equal to two to the power of the first number.

* * * * *